United States Patent
Luo et al.

(10) Patent No.: US 9,343,602 B2
(45) Date of Patent: May 17, 2016

(54) SOLAR CELL UNIT AND METHOD FOR MANUFACTURING THE SAME

(71) Applicants: Zhijiong Luo, Poughkeepsie, NY (US); Huilong Zhu, Poughkeepsie, NY (US); Haizhou Yin, Poughkeepsie, NY (US)

(72) Inventors: Zhijiong Luo, Poughkeepsie, NY (US); Huilong Zhu, Poughkeepsie, NY (US); Haizhou Yin, Poughkeepsie, NY (US)

( * ) Notice: Subject to any disclaimer, the term of this patent is extended or adjusted under 35 U.S.C. 154(b) by 131 days.

(21) Appl. No.: 13/950,510

(22) Filed: Jul. 25, 2013

(65) Prior Publication Data

US 2014/0238461 A1    Aug. 28, 2014

(30) Foreign Application Priority Data

Jul. 26, 2012   (CN) .......................... 2012 1 0261770

(51) Int. Cl.

| | |
|---|---|
| *H01L 31/0352* | (2006.01) |
| *H01L 31/04* | (2014.01) |
| *H01L 31/042* | (2014.01) |
| *H01L 31/05* | (2014.01) |
| *H01L 31/18* | (2006.01) |
| *H01L 31/20* | (2006.01) |

(52) U.S. Cl.
CPC ...... *H01L 31/035281* (2013.01); *H01L 31/042* (2013.01); *H01L 31/0504* (2013.01); *H01L 31/1804* (2013.01); *H01L 31/202* (2013.01); *Y02E 10/50* (2013.01); *Y02P 70/521* (2015.11)

(58) Field of Classification Search
CPC ..................... H01L 31/035281; H01L 31/042; H01L 31/0504; H01L 31/1804; H01L 31/202; H01L 31/0687
See application file for complete search history.

(56) References Cited

U.S. PATENT DOCUMENTS

| | | | | |
|---|---|---|---|---|
| 4,352,948 | A * | 10/1982 | Kaplow et al. ................ | 136/249 |
| 2010/0012167 | A1* | 1/2010 | Milshtein et al. ............. | 136/244 |
| 2010/0059109 | A1* | 3/2010 | Nakayashiki et al. ........ | 136/255 |
| 2012/0187543 | A1* | 7/2012 | Zhu et al. ...................... | 257/618 |

* cited by examiner

*Primary Examiner* — Mamadou Diallo
(74) *Attorney, Agent, or Firm* — Troutman Sanders LLP

(57) ABSTRACT

The present invention provides a solar cell unit, which comprises a semiconductor plate of first-type doping or second-type doping; wherein the semiconductor plate has a first surface and a second surface opposite to the first surface; the semiconductor plate comprises a first-type doping region and second-type doping region, both the first-type doping region and the second-type doping region are located on the first surface of the semiconductor plate; a first sheet is provided on the side surface of the semiconductor plate that is adjacent to the first-type doping region, and a second sheet is provided on the side surface of the semiconductor plate that is adjacent to the second type doping region.

21 Claims, 21 Drawing Sheets

SOLAR CELL UNIT AND METHOD FOR MANUFACTURING THE SAME

FIELD OF THE INVENTION

The present invention relates to the technical filed of solar cells, particularly, to a solar cell unit and a method for manufacturing the same.

BACKGROUND OF THE INVENTION

Due to growing concern of energy shortage and environmental challenges, solar energy has been regarded as a potential solution. At the heart of the photovoltaic industry is a solar cell which converts photon energy to electrical energy. With rapid technological advancements in the photovoltaic industry, solar cells have been widely used in various applications. From the creation of solar cells, the technicians working in this technical field have devoted themselves to improve conversion efficiency of solar cells.

As shown in FIG. 37, a solar cell unit in the prior art typically comprises a semiconductor plate 10 of p-type doped configuration or n-type doped configuration; a p+ doping region 20 is arranged on a primary surface of the semiconductor plate 10, while an n+ doping region 30 is arranged on another primary surface of the semiconductor plate 10. Wherein the thickness of semiconductor plate 10 is typically less than 200 μm. The aforementioned structure puts constraint on the thickness of the solar cell unit; namely, the solar cell unit in aforementioned structure cannot be made fairly thin. In the case the thickness of a solar cell unit is made fairly thin, in particular the thickness of the solar cell unit is close to or smaller than the width of depletion region, the light adsorption efficiency of the solar cell unit would be weakened, and the electrical current in the solar cell unit would become smaller when the thickness of the solar cell unit becomes thinner, which consequently curtails performance of the solar cell unit. Thus, the utility of the semiconductor plate material cannot be further improved. Particularly, it is impossible to increase the number of semiconductor plates, when the semiconductor plates are made out of a substrate.

Additionally, in aforementioned structure, electrodes have to be built on two surfaces of the semiconductor plate so as to form the positive and negative of the solar cell unit. However, the electrodes would block light and degrade energy conversion efficiency of the solar cell unit.

Accordingly, it is necessary to provide a solar cell unit and a method for manufacturing the same to solve some of the aforementioned problems.

SUMMARY OF THE INVENTION

The present invention is intended to provide a solar cell unit and a method for manufacturing the same, which allows to reduce the thickness of the semiconductor plate of the solar cell unit at the meantime of maintaining or improving performance of the solar cell unit, thereby improving utility of the semiconductor plate material and increasing yield of the semiconductor plate manufacturing. In addition, the present invention is further intended to provide a solar cell unit that doesn't require formation of electrodes on two surfaces of the semiconductor plate.

In an aspect, the present invention provides a method for manufacturing a solar cell unit, which comprises following steps:

a) providing a substrate of first-type doping or second-type doping; the substrate comprises a first surface and a second surface opposite to the first surface;

b) forming at least two first grooves on the first surface of the substrate, and forming at least a second groove on the second surface of the substrate; wherein, each of the second groove is located between two neighboring first grooves, and the depth of the first groove and the second groove is smaller than the thickness of the substrate;

c) performing first-step doping on the sidewalls of the first groove so as to form a first-type doping region on the sidewalls thereof;

d) removing a part of the substrates at the bottoms of the first groove and the second groove, such that the depth of the first groove and the second groove is still smaller than the thickness of the substrate;

e) forming a protection layer on the sidewalls of the first groove;

f) continuing to remove a part or all of the substrates at the bottoms of the first groove and the second groove, so as to form a plurality of parallel substrate plates; wherein, the two neighboring semiconductor plates are connected with each other by a sheet;

g) performing second-step doping on the sidewalls of the first groove, wherein the type of dopants is opposite to that used in the step c), and forming a second-type doping region on the sidewalls of the first groove that have not been covered by the protection layer, so as to form a vertical strip plate array of solar cell units.

In another aspect, the present invention further provides a method for manufacturing an array of solar cell units, which comprises following steps:

a) providing a substrate of first-type doping or second-type doping; the substrate comprises a first surface and a second surface opposite to the first surface;

b) forming at least two first grooves on the first surface of the substrate, wherein, the depth of the first groove is smaller than the thickness of the substrate;

c) performing first-step doping on the sidewalls of the first groove so as to form a first-type doping region on the sidewalls thereof;

d) removing a part of the substrate at the bottom of the first groove such that the depth of the first groove is still smaller than the thickness of the substrate, and forming a protection layer on the sidewalls of the first groove;

e) continuing to remove a part or all of the substrate at the bottom of the first groove;

f) performing second-step doping on the sidewalls of the first groove, wherein the type of dopants is opposite to that used in the step c), and forming a second-type doping region on the sidewalls of the first groove that have not been covered by the protection layer;

g) forming at least a second groove on the second surface of the substrate to form a vertical strip plate array of solar cell units; wherein, each of the second groove is located between two neighboring first grooves, and the two neighboring solar cell units are connected with each other by a sheet.

In another aspect, the present invention further provides a method for manufacturing a solar cell unit assembly, which comprises following steps:

a) extending the aforementioned vertical strip plate array of solar cell units along a pre-determined direction, such that the first surface and the second surface opposite to the first surface of the solar cell units are positioned respectively on two parallel planes, so as to form a planar array of solar cell units;

wherein, the first-type doping region and the second-type doping region of the solar cell unit are on the first surface of the solar cell unit;

b) placing the planar array of solar cell units onto a lower packaging encapsulation; wherein, the first surfaces of the solar cell units are in contact with the lower packaging encapsulation;

c) electrically connecting the first-type doping regions of the two neighboring solar cell units with a first conductive bar, and electrically connecting the second-type doping regions of the two neighboring solar cell units with a second conductive bar;

d) electrically connecting the first conductive bars with a first tabbing ribbon, and electrically connecting the second conductive bars with a second tabbing ribbon.

In another aspect, the present invention further provides a solar cell unit, which comprises: a semiconductor plate of first-type doping or second-type doping; wherein the semiconductor plate has a first surface and a second surface opposite to the first surface, and a first-type doping region and a second-type doping region are incorporated into the semiconductor plate on a side of the first surface.

In another aspect, the present invention further provides a solar cell unit assembly, which comprises a plurality of the aforementioned solar cell units, wherein:

The first surface and the second surface opposite to the first surface of the solar cell unit are positioned respectively on two parallel planes, so as to form a planar array of solar cell units; wherein, with respect to the two neighboring solar cell units, their two neighboring doping regions are doping regions of the same type;

The first-type doping regions of each solar cell unit are electrically connected, and the second-type doping regions of each solar cell unit are also electrically connected.

In another aspect, the present invention further provides an array of solar cell units, which comprises a plurality of the aforementioned parallel solar cell units. Wherein:

With respect to any one of the solar cell units, one of its ends is perpendicular to a first sheet and comes into connection with a solar cell unit at a side of said solar cell unit via the first sheet, and the other end thereof is perpendicular to a second sheet and comes into connection with a solar cell unit at the other side of the solar cell unit via the second sheet. Wherein, with respect to the two neighboring solar cell units connected by the first sheet, the first surfaces of the two solar cell units face against each other, and the second surfaces thereof face to each other; with respect to the two neighboring solar cell units connected by the second sheet, the first surfaces thereof face to each other, and the second surfaces thereof face against each other. Besides, with respect to any two neighboring solar cell units, all the first-type doping regions on the first surface are connected with the first sheet, and all the second-type doping regions on the second surface are connected with the second sheet.

As compared to the prior art, the present invention exhibits following advantages: in the case the solar cell unit is fairly thin, the presence of photogenic charge carriers is quite close to the PN junction, which is favorable for diffusion of photogenic charger carriers to the PN junction. Accordingly, as compared to traditional solar cell units, in the case the solar cell unit is fairly thin, especially, when the thickness of the solar cell units is less than 80 μm, the solar cell units provided according to the present invention is capable of effectively collecting photogenic charge carriers, thereby improving electrical current density of the solar cell units and improving photo-electrical conversion efficiency. Since the thickness of the solar cell units may be reduced without causing adverse effects to its efficiency, which thus enables to make more solar cell units out of each substrate, thereby increasing manufacturing yield. Additionally, since the two electrodes of the solar cell unit are formed on the same surface (backlight surface) of the solar cell unit, thus there is no electrode positioned on the light absorption surface, which avoids blocking light absorption of the solar cell units. In this way, the light absorption efficiency of the solar cell units is improved, which therefore improves conversion efficiency of the solar cell units.

BRIEF DESCRIPTION OF THE DRAWINGS

Other additional features, aspects and advantages of the present invention are made more evident according to perusal of the following detailed description of exemplary embodiment(s) in conjunction with accompanying drawings.

The same or similar reference signs in the appended drawings denote the same or similar elements.

DETAILED DESCRIPTION OF THE INVENTION

Embodiments of the present invention are to be described at length below, wherein examples of embodiments are illustrated in the appended drawings. It should be appreciated that embodiments described below in conjunction with the drawings are illustrative, and are provided for explaining the present invention only, thus shall not be interpreted as a limit to the present invention. Various embodiments or examples are provided here below to implement different structures of the present invention. To simplify the disclosure of the present invention, descriptions of components and arrangements of specific examples are given below. They are only illustrative and not intended to limit the present invention. Moreover, in the present invention, reference numbers and/or letters may be repeated in different examples. Such repetition is for purposes of simplicity and clarity, yet does not denote any relationship between respective embodiments and/or arrangements under discussion. Furthermore, the present invention provides various examples for various processes and materials. However, it is obvious for a person of ordinary skill in the art that other processes and/or materials may be alternatively utilized. It should be noted that the appended drawings might not be drawn to scale. Description of the conventionally known elements, processing techniques and crafts are omitted from description of the present invention in order not to limit the present invention unnecessarily.

Figure 1:
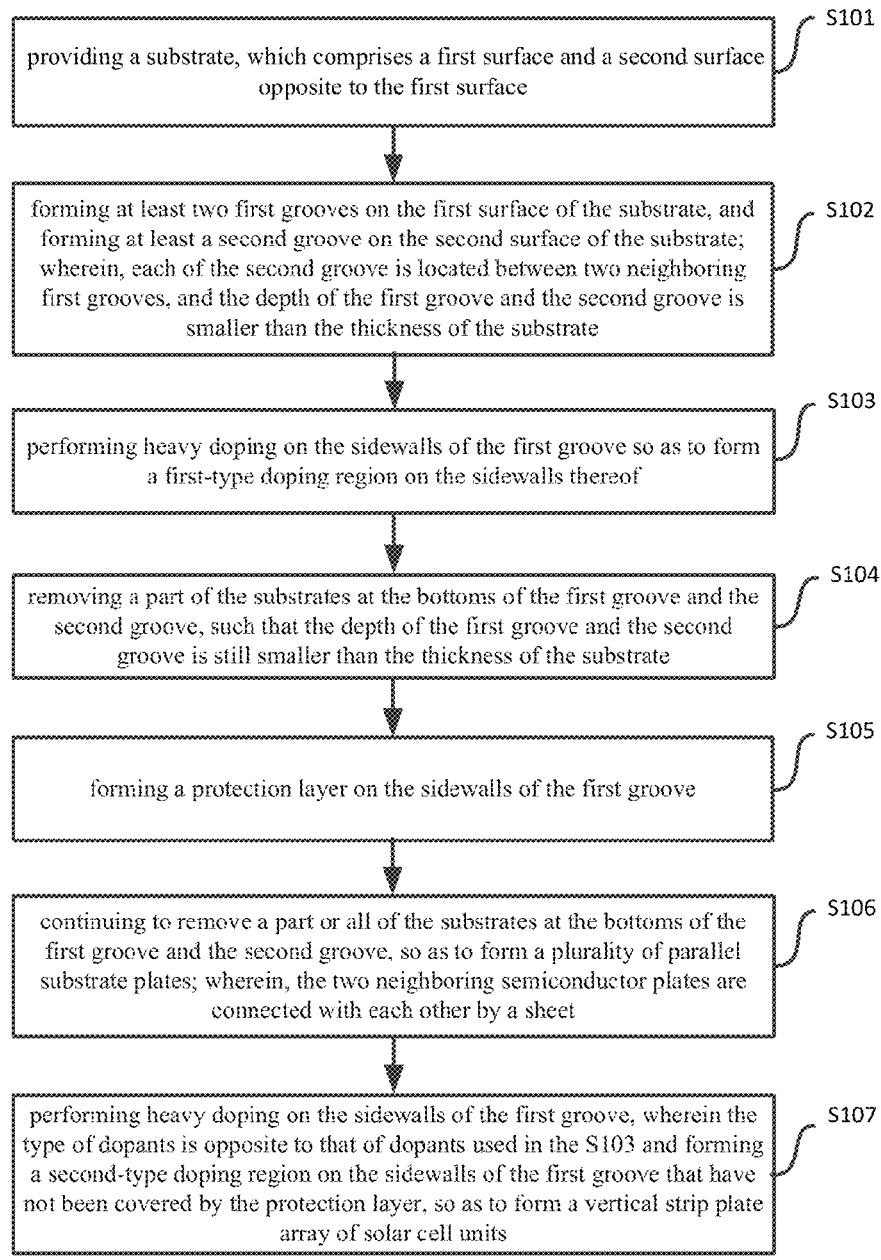
FIG. 1 shows a diagram of a method for manufacturing an array of solar cell units according to an aspect of the present invention.

FIG. 1 shows a diagram of a method for manufacturing an array of solar cell units according to an embodiment of the present invention. Here below, the method for manufacturing a solar cell unit is to be elucidated with reference to FIG. 2 to FIG. 13.

Figure 2:
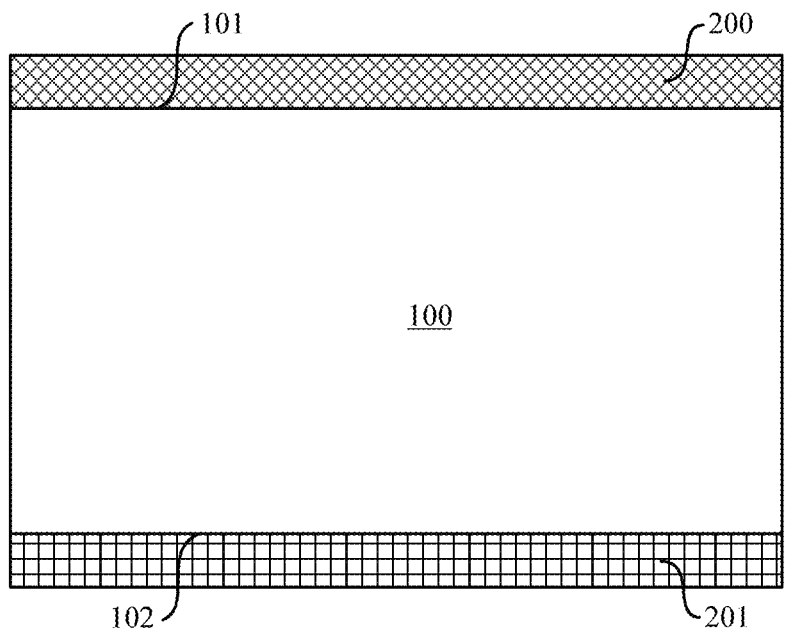
FIG. 2 to FIG. 13 show cross-sectional views at each stage of manufactured a vertical strip plate array of solar cell units according to the method shown in FIG. 1.

At step S101, a substrate 100 is provided; wherein the substrate 100 comprises a first surface 101 and a second surface 102 opposite to the first surface 101. Specifically, as shown in FIG. 2, a substrate 100 is provided; wherein the substrate 100 comprises a first surface 101 and a second surface 102 opposite to the first surface 101. The material for the substrate 100 may be any one selected from a group consisting of monocrystalline Si, monocrystalline Ge, monocrystalline SiGe, poly Si, poly Ge, poly SiGe, amorphous Si, amorphous Ge, amorphous SiGe, compound semiconductors of III-V or II-VI group or combinations thereof. In a preferred embodiment of the present invention, the semiconductor substrate 100 comprises monocrystalline Si, monocrystalline Ge or monocrystalline SiGe. Preferably, the crystal orientation of the first surface 101 and the second surface 102 is {110} or {112}. The thickness of the substrate 100 is preferably less than 1 cm. The substrate 100 may be of first-type doping or second-type doping; wherein, the first-type doping and the second-type are opposite to each other; in other words, if the first-type doping is n-type, then the second-type doping is p-type, vice versa.

In particular, a first sheet 200 and a second sheet 201 are formed on the first surface 101 and the second surface 102 of the substrate 100. The first sheet 200 and the second sheet 201 can be formed either individually or concurrently. The material for the first sheet 200 and/or the second sheet 201 is preferably any one selected from the group consisting of $SiO_2$, $Si_3N_4$, metal oxides, organic insulating materials or combinations thereof. The first sheet 200 and/or the second sheet 201 may be in a single-tier structure or may be in a multi-tier structure, with a thickness desirable to the needs in practice.

At step S102, at least two first grooves 300 are formed on the first surface 101 of the substrate 100, and at least a second groove 301 is formed on the second surface 102 of the substrate 100; wherein, each of the second groove 301 is located between two neighboring first grooves 300, and the depth of the first groove 300 and the second groove 301 is smaller than the thickness of the substrate 100.

Figure 3:
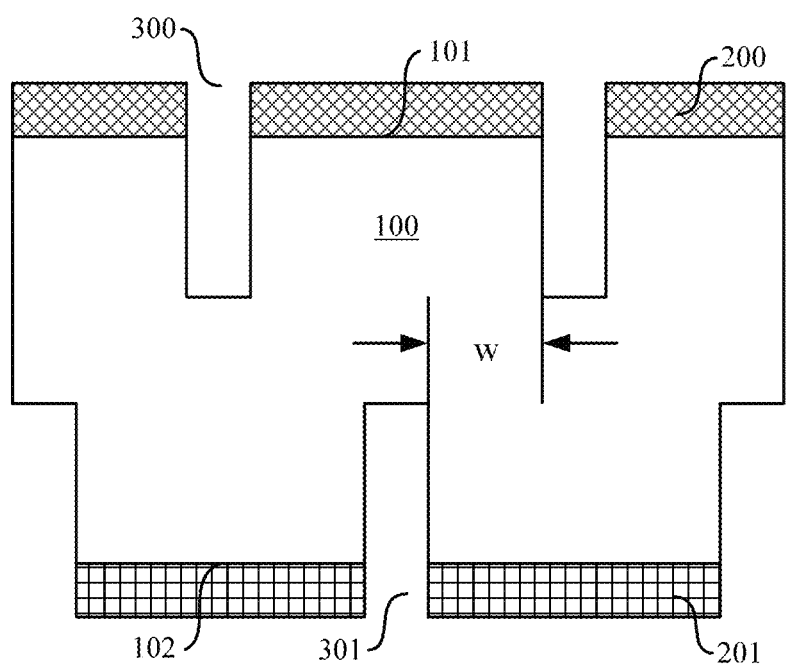

Specifically speaking, the first sheet 200 and the second sheet 201 are patterned (e.g., through lithography process in addition to etching) to form a plurality of openings with predetermined space (not shown) on the first sheet 200 and the second sheet 201, so as to expose the locations where the grooves to be formed on the substrate at subsequent steps. According to an embodiment of the present invention, the lateral space/distance between the openings on the first sheet 200 and the openings on the second sheet 201 may be less than 80 μm. Then, the substrate 100 is etched with the patterned first sheet 200 and the second sheet 201 functioning as masks, such that at least two first grooves 300 are formed on the first surface 101 of the substrate 100, and at least one second groove 301 is formed on the second surface 101 of the substrate 100, as shown in FIG. 3. The first groove 300 and the second groove 301 are opened toward/facing opposite directions; and each of the second groove 301 is located between two neighboring first grooves 300, in an alternative manner. The depth of the first groove 300 and/or the second groove 301 is less than the thickness of the substrate 100. Preferably, the depth of the first groove 300 is less than a half of the thickness of the substrate 100. In the embodiment where the crystal orientation of the first surface 101 and the second surface 102 is {110} or {112}, the first groove 300 and the second groove 301 are formed by means of wet etching. Namely, the sidewall crystal orientation of the first groove 300 and the second groove 301 is made to be {111} by way of controlling their opening directions; then, the substrate 100 is placed into a solution such as KOH, TMAH or EPD for corrosion; the depth of the first groove 300 and the second groove 301 can be controlled by way of controlling the concentration of the solution and the corroding duration. In other embodiments, the first groove 300 and the second groove 301 may be formed by means of dry etching, or combination of wet etching and dry etching. With respect to the neighboring first groove 300 and the second groove 301, the lateral space between the sidewalls of the two grooves (denoted by w in FIG. 3) is preferably less than 150 μm.

At step S103, the sidewalls of the first groove 300 are doped to form a first-type doping region 400 on the sidewalls.

Figure 4:
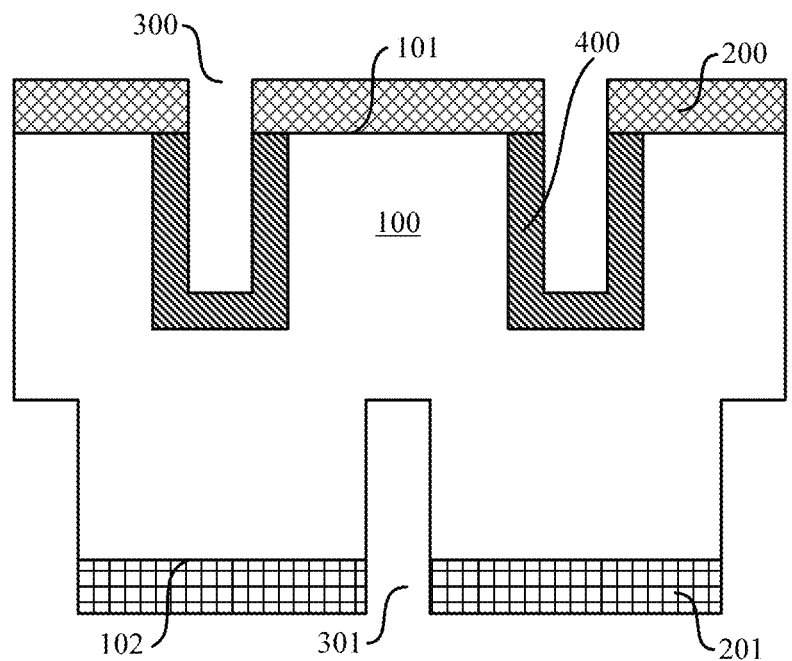

Specifically, since it is merely necessary to perform heavy doping to the sidewalls of the first groove 300, therefore a covering layer (not shown) is formed on the sidewalls and at the bottom of the second groove 301 before performance of heavy doping; the material for the covering layer may be any one selected from a group consisting of $SiO_2$, $Si_3N_4$ and combinations thereof, or any other materials as appropriate. Wherein, the material for the covering layer is preferably different from the material for the second sheet 201. Then, the substrate 100 is process with semiconductor dopants diffusion or CVD in-situ doping, so as to form the first-type doping region 400 in the substrate 100 on both sides of the sidewalls of the first groove 300, as shown in FIG. 4. Wherein, if the dopants are p-type, then the first-type doping region 400 is p+ doping region; if the dopants are n-type, then the first-type doping region 400 is n+ doping region. The covering layer may be removed from the sidewalls and the bottom of the second groove 301 after completion of doping.

In other embodiments, the second surface 102 of the substrate may be bond with a wafer cap, then the bond substrate 100 and the wafer cap are placed into a diffusion furnace, such that the substrate 100 is doped by means of semiconductor dopants diffusion or CVD in-situ doping. Because the second surface 102 of the substrate 100 is covered by the wafer cap, thus it is possible that the first-type doping regions 400 are formed only in the substrate 100 on both sides of the sidewalls of the first groove 300.

At step S104, a part of the substrates 100 at the bottom of the first groove 300 and the second groove 301 is removed, such that the depth of the first groove 300 and the second groove 301 is still smaller than the thickness of the substrate.

Figure 5:
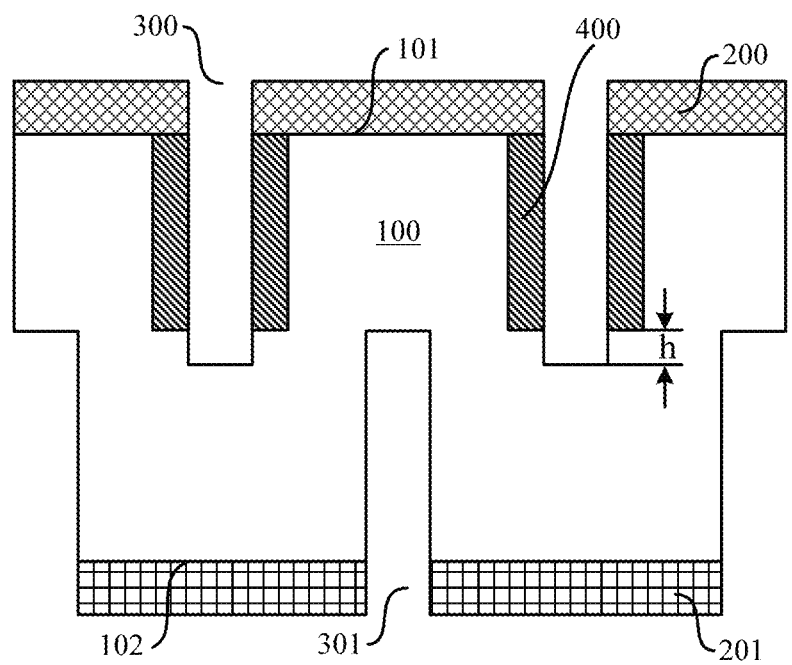

Specifically, as shown in FIG. 5, the substrate 100 is etched continuously by means of wet etching and/or dry etching, and a part of the substrates 100 at the bottom of the first groove 300 and the second groove 301 is removed, such that the depth of the first groove 300 and the second groove 301 is furthered but is still smaller that the thickness of the substrate. In an embodiment, the etching depth (denoted by h in FIG. 5) is in the range of 50 μm-2000 μm. Since a part of the substrates 100 at the bottom of the first groove 300 and the second groove 301 has been removed, thus the substrate 100 at both sides of the sidewalls at the furthered portion of the first groove 300 has not gone through the heavy doping.

At step S105, a protection layer 401 is formed on sidewalls of the first groove 300.

Figure 6:
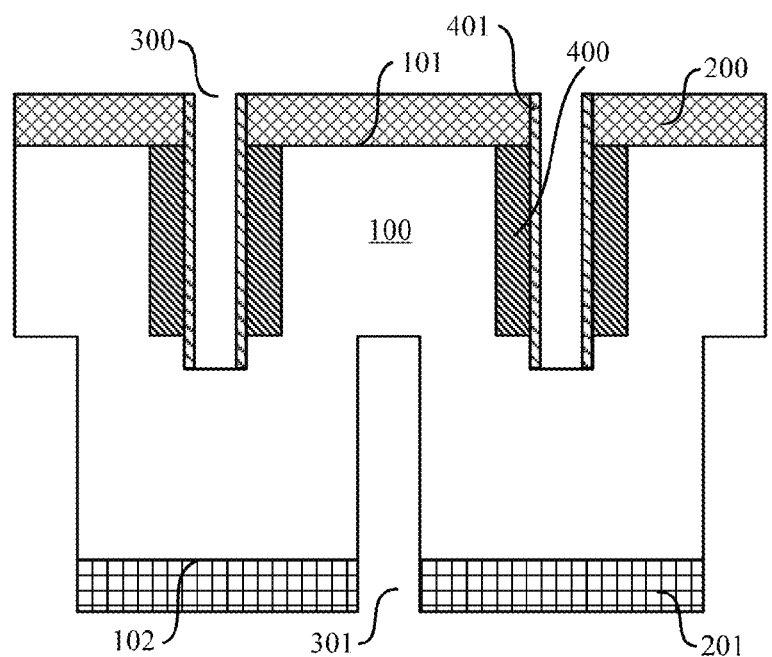

Specifically, as shown in FIG. 6, the protection layer 401 is formed on the sidewalls of the first groove 300 by means of, for example, deposition to protect the first-type doping regions 400 and the undoped substrates 100 on both sides of the sidewalls of the first groove 300. Wherein, the material for the protection layer 401 may be any one selected from the group consisting of $SiO_2$, $Si_3N_4$ or combinations thereof, or alternatively any other material as appropriate. The material for the protection layer 401 is preferably different from that of the first sheet 200. Particularly, because furthered etching has been performed at step S104, so the depth of the protection layer 401 is greater than the depth of the first-type doping regions 400.

At step S106, a part or all of the substrates 100 at the bottom of the first groove 300 and the second groove 301 is removed, so as to form a plurality of parallel semiconductor plates 500; wherein, two neighboring semiconductor plates 500 are connected by a sheet.

Figure 7:
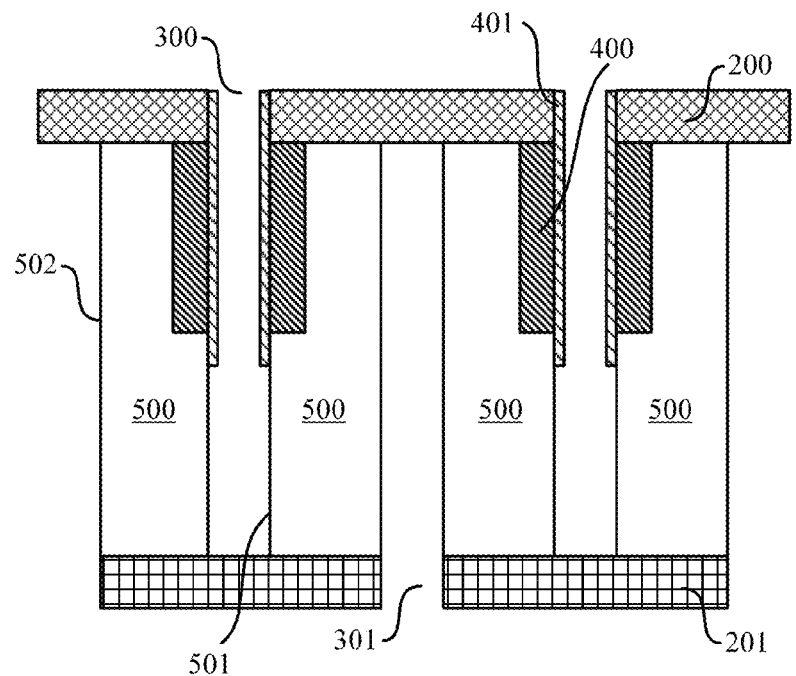

Specifically, as shown in FIG. 7, all of the substrates 100 at the bottoms of the first groove 300 and the second groove 301 is removed completely by means of wet etching and/or dry etching till the second sheet 201 and the first sheet 200 are exposed, so as to form a plurality of parallel semiconductor plates 500; the two neighboring semiconductor plates 500 are connected by the first sheet 200 or the second sheet 201. In other embodiments, it is also applicable to remove only a part of the substrates 100 at the bottoms of the first groove 300 and the second groove 301; namely, the bottom of the first groove 300 and the bottom of the second groove 301 do not reach the second surface 102 and the first surface 101 of the substrate 100; and the substrates 100 between the first groove 300 and a neighboring second groove 301 constitute the semiconductor plates 500. The sidewalls of the first groove 300 form the first surfaces 501 of the semiconductor plates 500, and the sidewalls of the second groove 301 constitute second surfaces 502 of the semiconductor plates 500. The thickness of the semiconductor plate 500 is equivalent to the distance from the first surface 501 to the second surface 502, which is preferably less than 150 μm. The thickness of the semiconductor plate 500 can be controlled by way of controlling lateral distance between the opening on the first sheet 200 and the opening on the neighboring second sheet 201 at the step S102. Owing to the existence of the protection layer 401, a part of the first surface 501 of the semiconductor plate 500 has been covered, while the remaining part thereof is exposed.

At step S107, doping is performed to the sidewalls of the first groove 300; wherein, the type of dopants is opposite to that of dopants used at the step S103; a second-type doping region 402 is formed on the sidewalls of the first groove 300 that have not been covered by the protection layer 401, so as to form a vertical strip plate array of solar cell units.

Figure 8A:
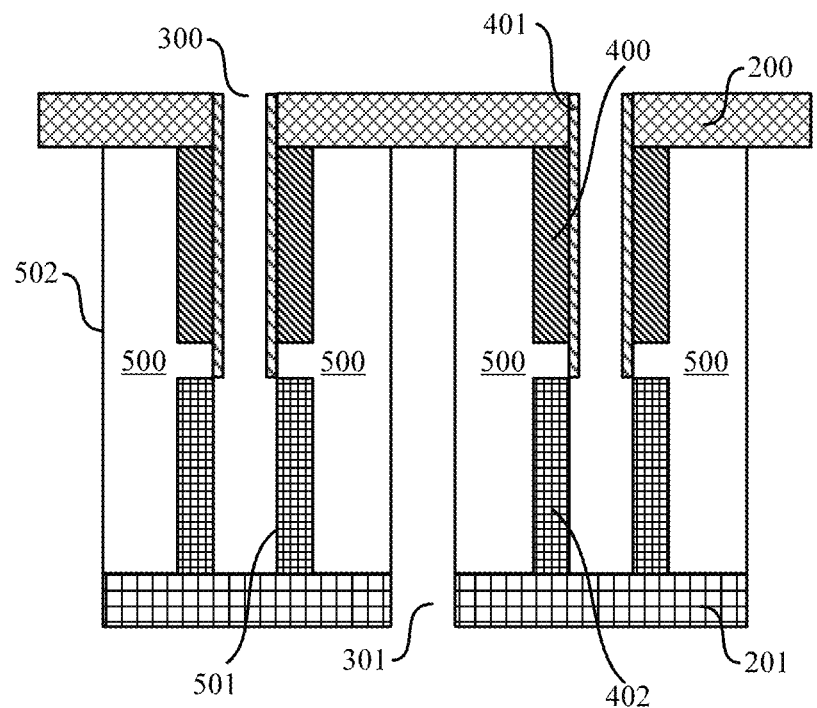

Specifically, as shown in FIG. 8a, the second surface 502 of the semiconductor plate 500 is protected (e.g. by way of covering the second groove 301 with a wafer cap), then the semiconductor plate 500 is doped by means of semiconductor dopants diffusion or CVD in-situ doping, then the second-type doping region 402 is formed on the first surface 501 of the semiconductor plate that has not been covered by the protection layer 401 (namely, on the sidewalls of the first groove 300 that have not been covered), so as to form a vertical strip plate array of solar cell units. Wherein, the type of dopants in the second-type doping region 402 is opposite to the type of dopants in the first-type doping region 400; if the first-type doping region 400 is p+ doping region, then the second-type doping region 402 is n+ doping region; if the first-type doping region 400 is n+ doping region, then the second-type doping region 402 is p+ doping region. Since the depth of the protection layer 401 is grater than the depth of the first-type doping region 400, thus the second-type doping region 402 is to be separated from the first-type doping region 400. The second surface 502 functions as the light absorption surface of the solar cell unit, while the first surface 501 that has been doped functions as the backlight surface of the solar cell unit. Finally, the edge of the substrate 100 is cut off by means of leaser beam or other cutting means, such that the vertical strip plate array of solar cell units is separated from the substrate 100.

Figure 8B:
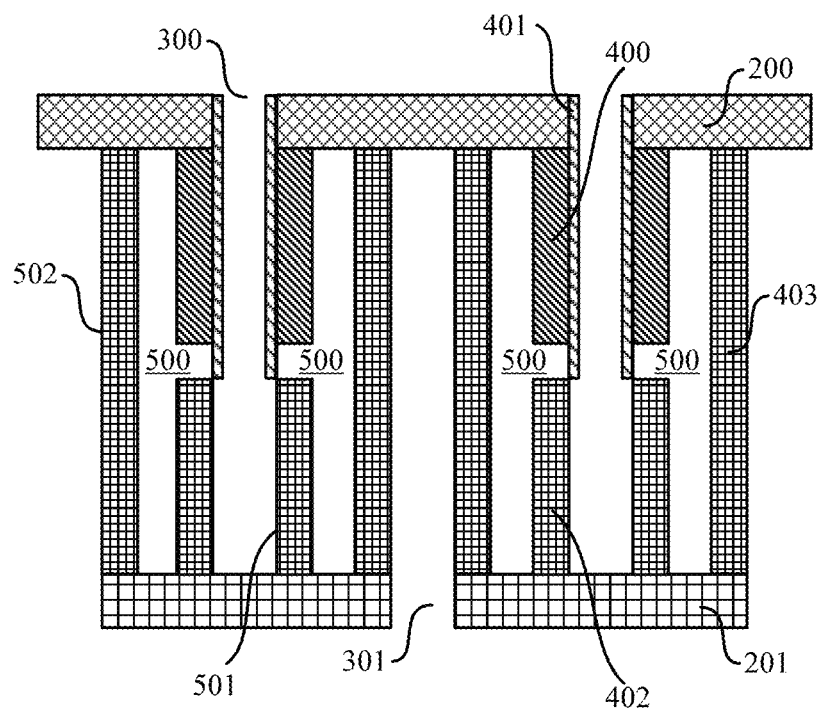

Preferably, in order to further reduce the surface resistance of the solar cell units, a p+ semiconductor layer 403 or an n+ semiconductor layer 403 may be formed on the second surface 502 of the semiconductor plate 500. Specifically, as shown in FIG. 8b, when the second-type doping region 402 is formed on the first surface 501 of the semiconductor plate 500, the whole semiconductor plate 500 is doped by means of semiconductor dopants diffusion or CVD in-situ doping; namely, it is not necessary to protect the second surface 502 of the semiconductor plate 500. In this way, at the meantime of forming the second-type doping region 402 through performing heavy doping to the first surface 501 of the semiconductor plate 500, heavy doping with the same type of dopants also is performed to the second surface 502 of the semiconductor plate 500. Wherein, if the second-type doping region 402 is n+ doping region, then an n+ semiconductor layer 403 is formed on the second surface 502 of the semiconductor plate 500; if the second-type doping region 402 is p+ doping region, then a p+ semiconductor layer 403 is formed on the second surface 502 of the semiconductor plate 500. Usually, the semiconductor layer 403 and the substrate 100 have the same type of doping. The formation of the p+ semiconductor layer 403 or n+ semiconductor layer 403 can effectively reduce the surface resistance of the solar cell units, so as to further improve performance of the solar cell units.

Figure 9:
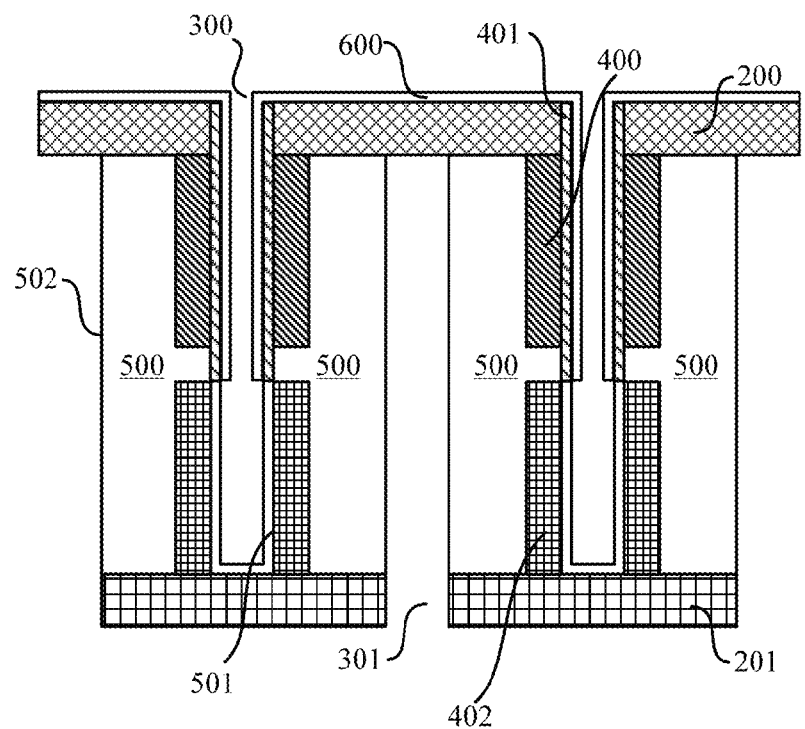
Figure 10:
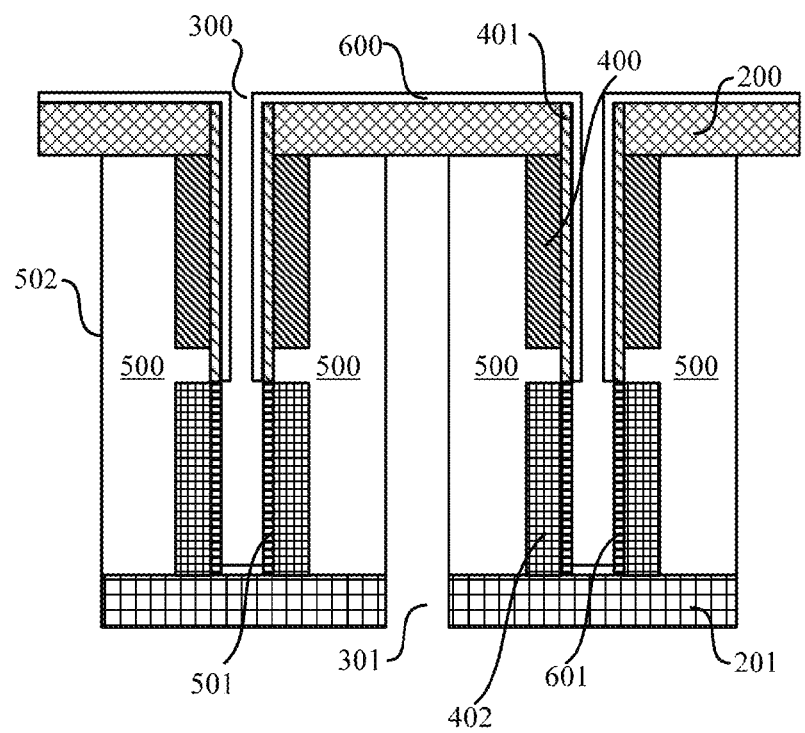

Preferably, after formation of the first-type doping region 400 and the second-type doping region 402, a first contact layer 603 and a second contact layer 601 are formed respectively on the surfaces of the first-type doping region 400 and the second-type doping region 402, so as to reduce the contact resistance of the first-type doping region 400 and the second-type doping region 402. The steps for forming the first contact layer 603 and the second contact layer 601 are as follows: as shown in FIG. 9, protecting the second surface 502 (e.g. with a wafer cap), then forming a first metal layer 600 on the sidewalls (i.e. on the surface of the protection layer 401 and the surface of the second-type doping region 402) and at the bottom of the first groove 300 by means of deposition; wherein the material for the first metal layer 600 may be any one selected from a group consisting of Ni, Pt, Co, Al, Cr, Cu, Ag, Au, Fe, Pb, Zn, Ti, Mg, Sn or combinations thereof. Then, annealing process is carried out such that the first metal layer 600 has reaction with the second-type doping region 402, so as to form a second contact layer 601 on the surface of the second-type doping region 402, as shown in FIG. 10.

Figure 11:
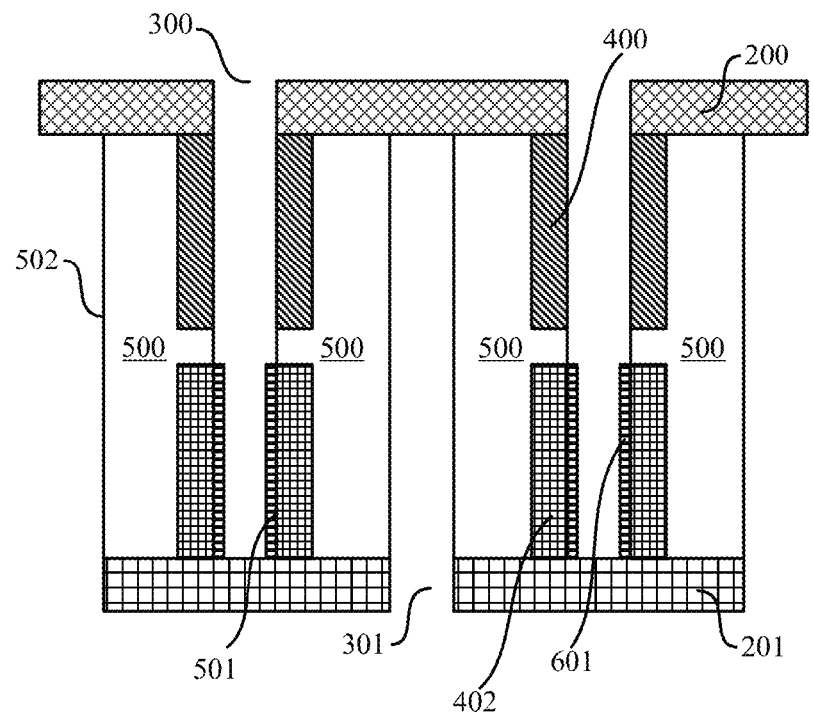
Figure 12:
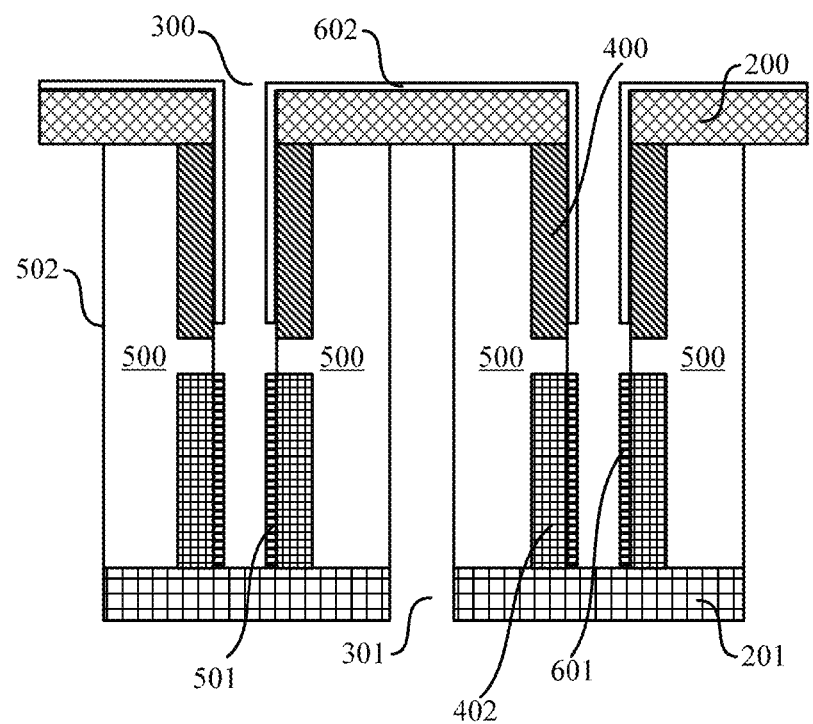

With further reference to FIG. 11, the first metal layer 600 and the protection layer 401 remained from reaction are removed such that the surface of the first-type doping region 400 is exposed. Then, as shown in FIG. 12, a second metal layer 602 is formed on a part or all of the surfaces of the first-type doping region 400 by means of angular deposition or other means as appropriate. Wherein, the material for the second metal layer 602 includes any one selected from the group consisting of Ni, Pt, Co, Al, Cr, Cu, Ag, Au, Fe, Pb, Zn, Ti, Mg, Sn or combinations thereof. In an embodiment, it is possible to form the second layer 602 not on the surface of the second-type doping region 402 but only on the surface of the first-type doping region 400 through controlling the process.

In other embodiments, the second metal layer 602 may be formed by way of dip coating capable of depth controlling; namely, the vertical strip plate array of solar cell units is dipped into metal slurry such that the metal slurry is present on surface of the first-type doping region 400 by way of controlling the dipping depth. After the metal slurry has cured, the second metal layer 602 is formed on the surface of the first-type doping region 400. Wherein, the metal slurry is preferably any one selected from a group consisting of Ni slurry, Co slurry, Pt slurry, Al slurry, Cr slurry, Cu slurry, Ag slurry, Au slurry, Fe slurry, Pb slurry, Zn slurry, Ti slurry, Mg slurry, Sn slurry or combinations thereof.

Figure 13:
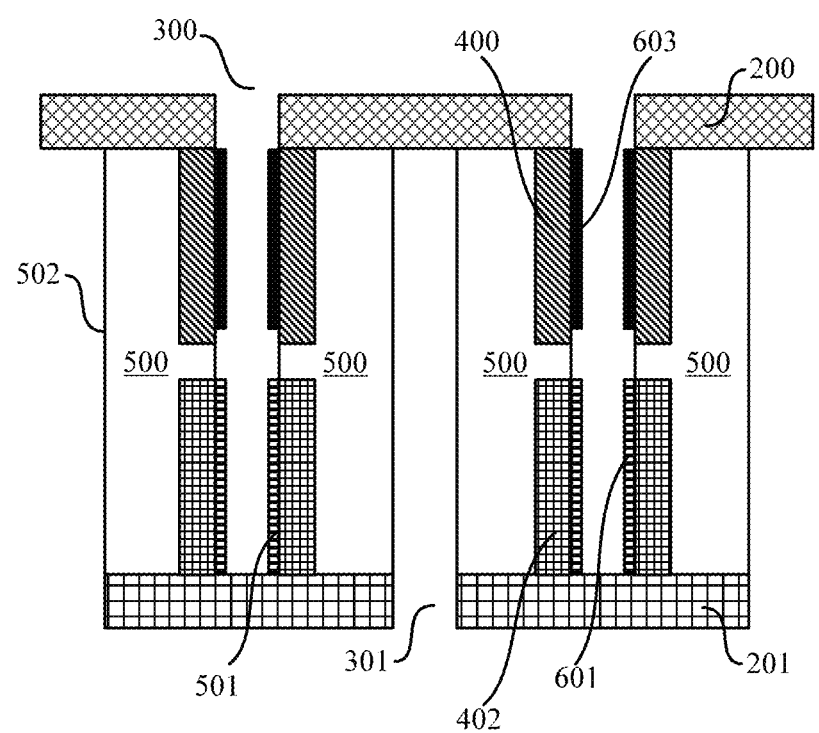

Next, as shown in FIG. 13, annealing treatment is carried out such that the first contact layer 603 is formed on the surface of the first-type doping region 400. In the case the material for the substrate 100 is monocrystalline Si, the first contact layer 603 and the second contact layer 601 are a metal and/or metal silicide layer. Wherein, the first contact layer 603 and/or the second contact layer 601 may be any one selected from the group consisting of Ni, Pt, Co, Al, Cr, Cu, Ag, W, Au, Fe, Pb, Zn, Ti, Mg, Sn, metal silicides thereof, or combinations thereof. Finally, a part of the second metal layer 602 remained from reaction may be removed selectively.

Preferably, a transparent insulating layer or a transparent conductive layer or a combination thereof may be further formed on the second surface 502 of the semiconductor plate 500 by means of CVD or PVD. In this way, it further increases light absorption, reduces surface re-combination or lowers surface resistance. The material for the transparent insulating layer may be $Si_3N_4$, $SiO_2$, metal silicide or combination thereof; the material for the transparent conductive layer is TCO, which includes: $SnO_2$, $In_2O_3$, ZnO, ITO, CdO, $Cd_2SnO_4$, FTO, AZO or combinations thereof.

Preferably, a flexible material layer (not shown) may be further formed on the surfaces of the first sheet 200 and the second sheet 201 that connect the solar cell units. The flexible material layer may be formed by means of spitting, CVD, PVD, ALD, deposition, spin coating or combination thereof. The material for the flexible material layer may be any one selected from a group consisting of metal, polymers, nano-materials or combinations thereof. The polymer may be any one selected from a group consisting of silicon, polypropylene, organic glass, acrylic acid resin, acrylic acid, PMMA, polycast, transparent composite resin, resin glass, poly-p-xylene, epoxy, polycarbonate, silicone, polyurethanes, polyamide, fluoropolymer, polyolefins, collagen, chitin, chitosan, alginate fibers, polyvinylpyrrolidone, PEG, PEO, polyethleneglycol, polyvinyl alcohol, PEG lactic acid, polylactic acid, PEL, polyamino acid, hydrogel, PDMS or combinations thereof; the nano-material comprises nanotube, Graphene or combinations thereof. The flexible layer should exhibit certain flexibility, extension and adhesiveness, such that it is capable of effectively lowering the risk that the first sheet 200 and/or the second sheet 201 may break at the time the semiconductor plate 500 is extended.

Figure 14:
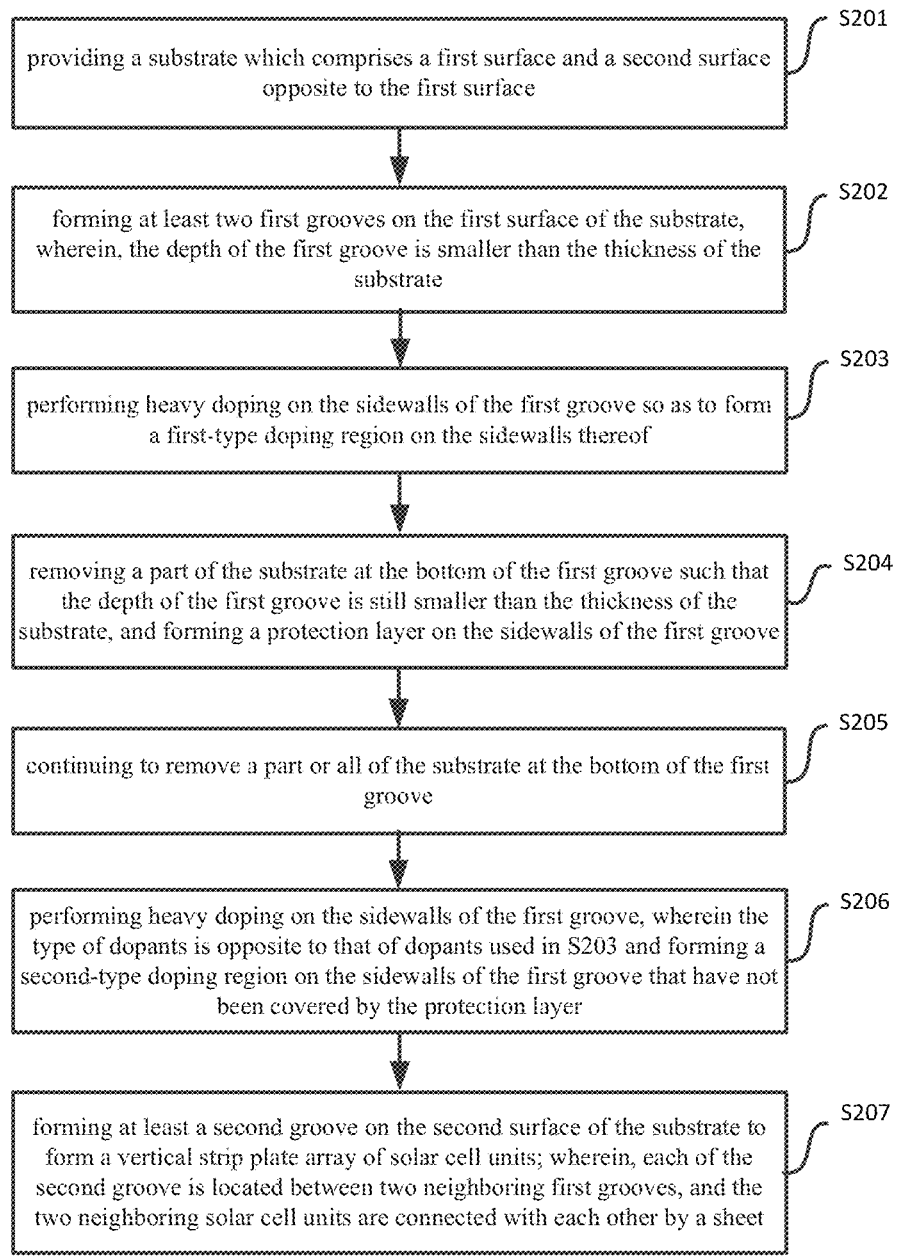
FIG. 14 shows a diagram of a method for manufacturing an array of solar cell units according to another aspect of the present invention.

FIG. 14 shows a diagram of a method for manufacturing an array of solar cell units according to another embodiment of the present invention. The present method is different from the method for manufacturing the solar cell units according to the aforementioned embodiment, in which the first groove and the second groove are formed concurrently, such that a covering layer has to be formed to protect the surface of the second groove when the first groove is processed (e.g. doping). However, in the present method, the first groove is formed firstly, while the second groove is formed after formation of the first-type doping region and the second-type doping region on sidewalls of the first groove, so as to form a vertical strip plate array of solar cell units. Here below, the method for manufacturing the solar cell unit as shown in FIG. 14 is elucidated with reference to FIG. 15 to FIG. 27b; wherein, the processes and materials adopted in the present method are same as those adopted in the previous method, so they are not described in detail here in order not to obscure.

Figure 15:
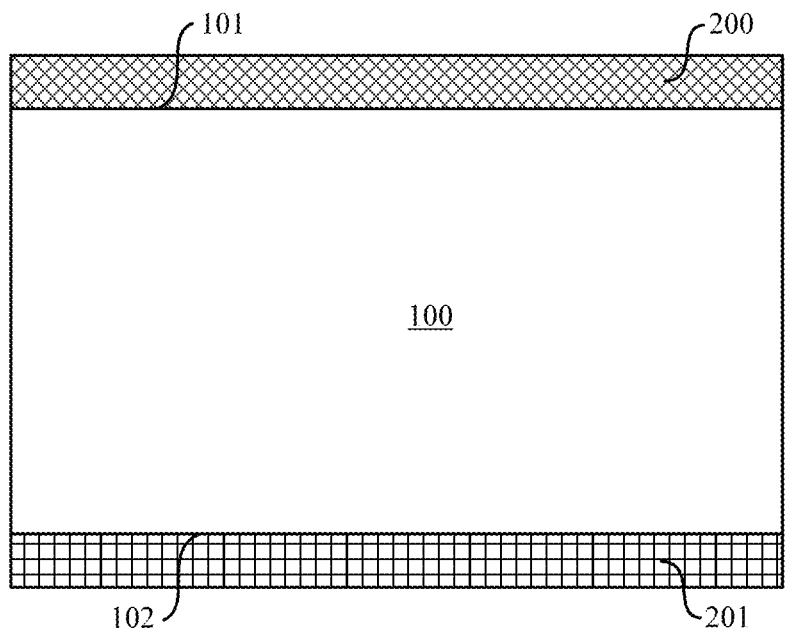
FIG. 15 to FIG. 27b show cross-sectional views at each stage of forming a vertical strip plate array of solar cell units according to the method shown in FIG. 14.

At step S201, as shown in FIG. 15, a substrate 100 is provided; the substrate 100 comprises a first surface 101 and a second surface 102 opposite to the first surface 101.

Figure 16:
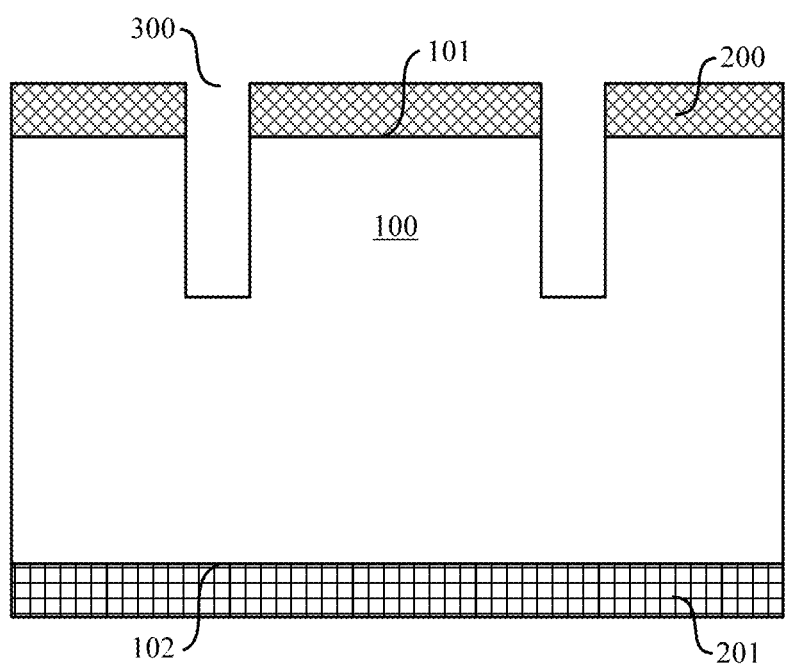

At step S102, as shown in FIG. 16, at least two first grooves 300 are formed on the first surface 101 of the substrate 100; wherein the depth of the first groove 300 is smaller than the thickness of the substrate 100.

Figure 17:
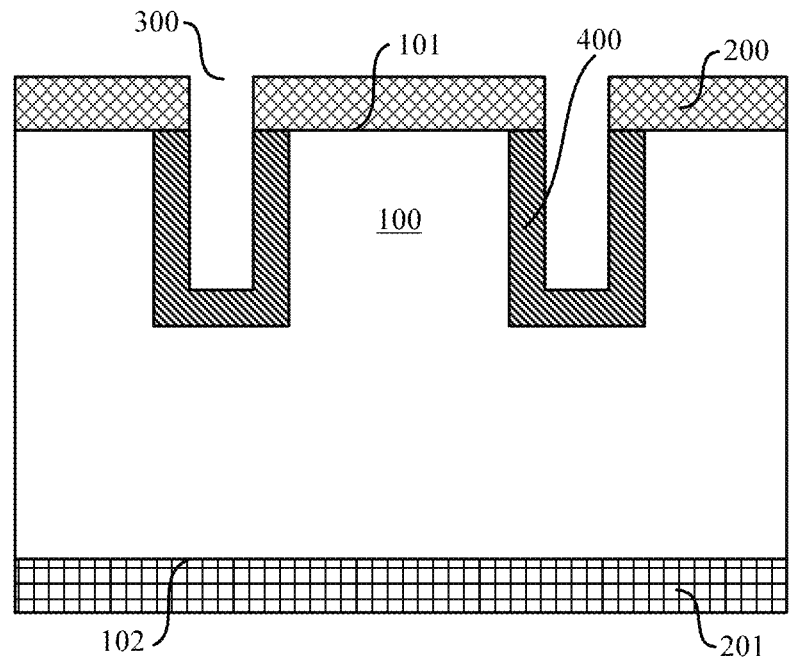

At step S203, as shown in FIG. 17, the sidewalls of the first groove 300 are doped to form first-type doping regions 400 on the sidewalls thereof.

Figure 18:
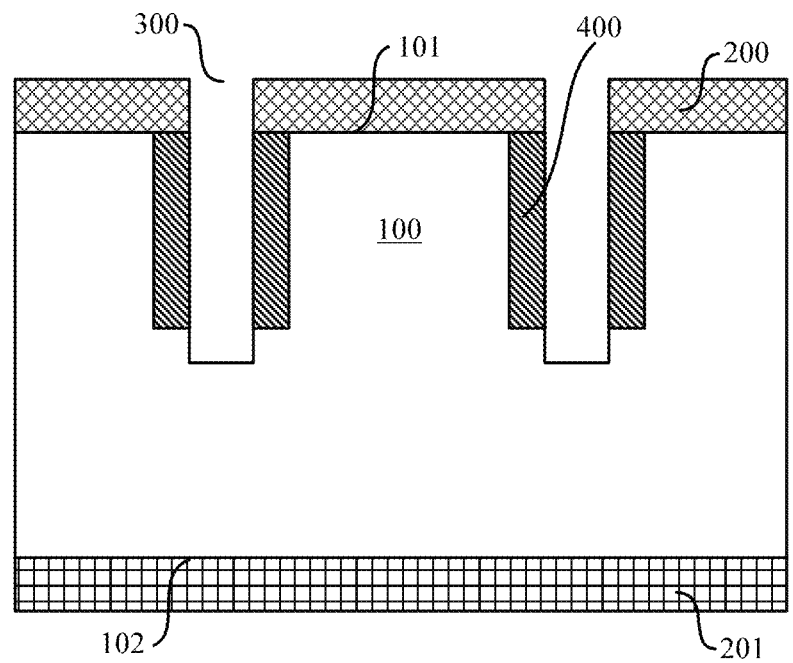
Figure 19:
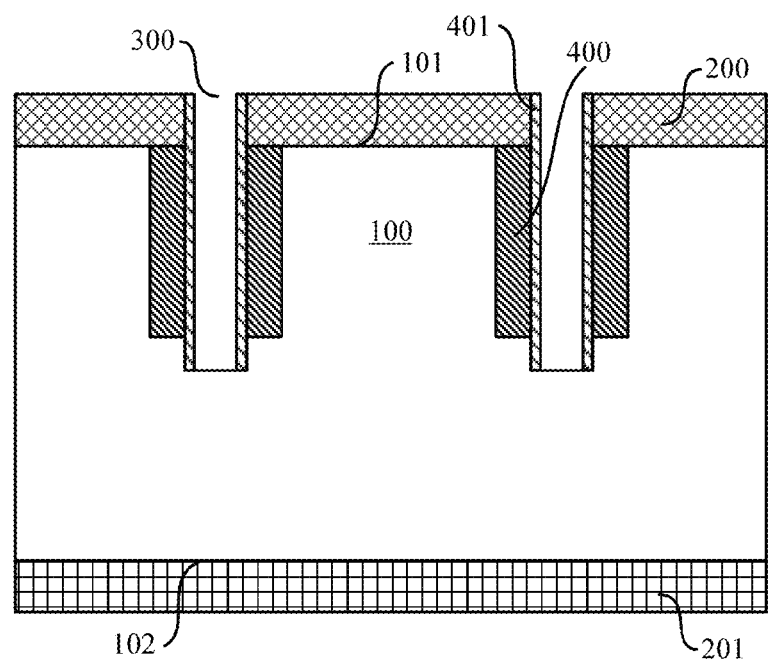

At step S204, as shown in FIG. 18 and FIG. 19, a part of the substrate 100 at the bottom of the first groove 300 is removed such that the depth of the first groove 300 is still smaller than the thickness of the substrate 100. Then, a protection layer 401 is formed on the sidewalls of the first groove 300.

Figure 20:
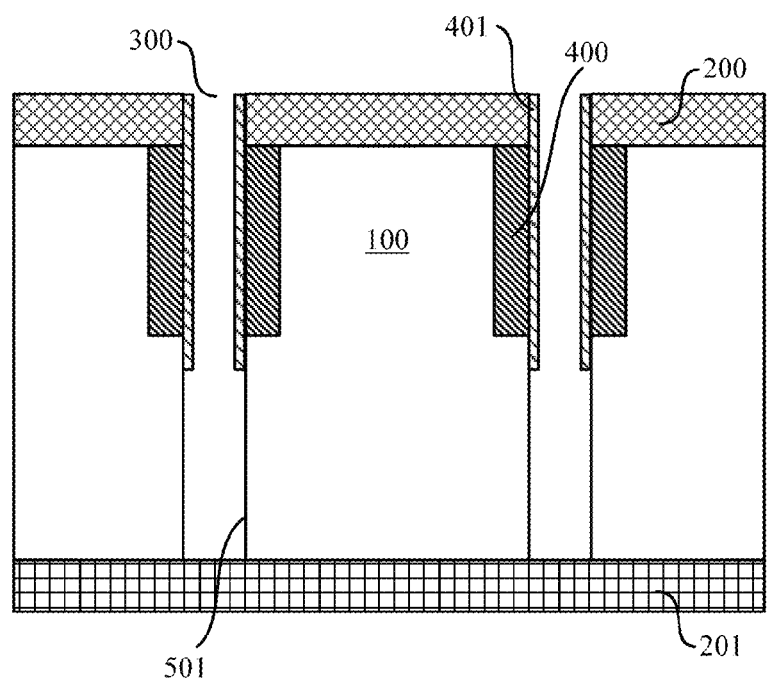

At step S205, as shown in FIG. 20, a part or all of the substrate 100 at the bottom of the first groove 300 is removed continuously.

Figure 21:
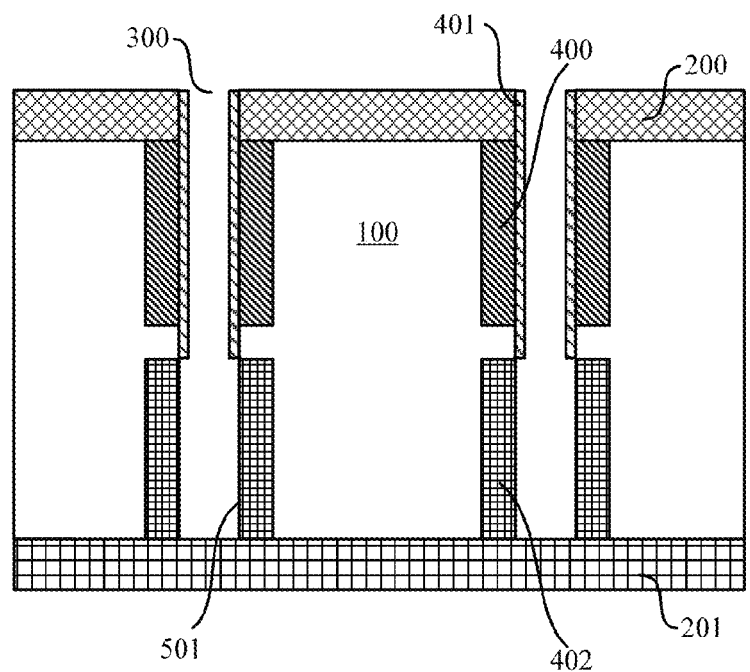
Figure 22:
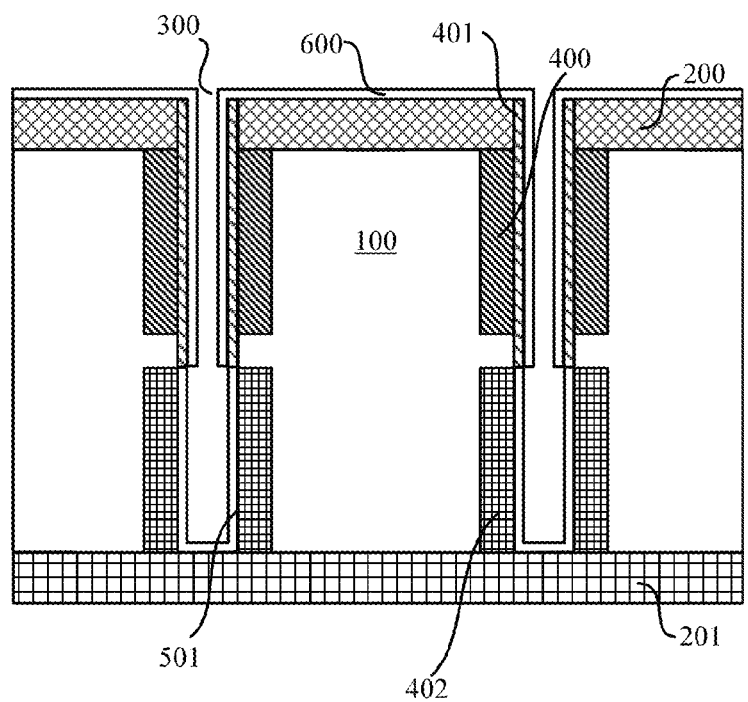
Figure 23:
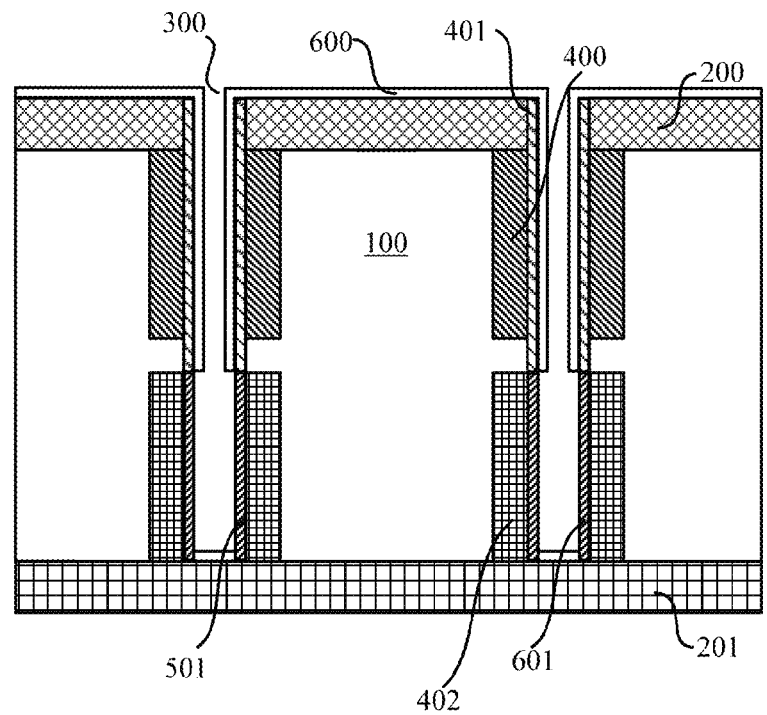
Figure 24:
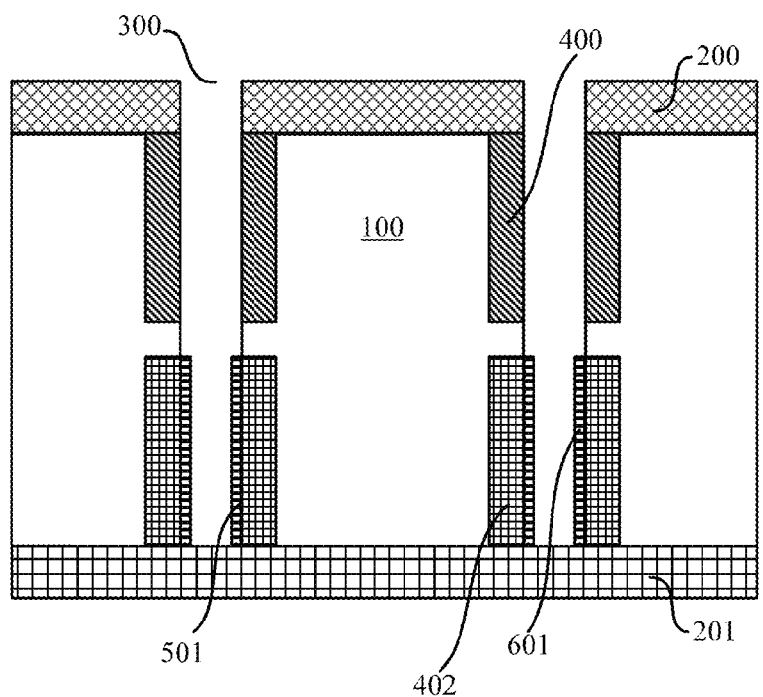
Figure 25:
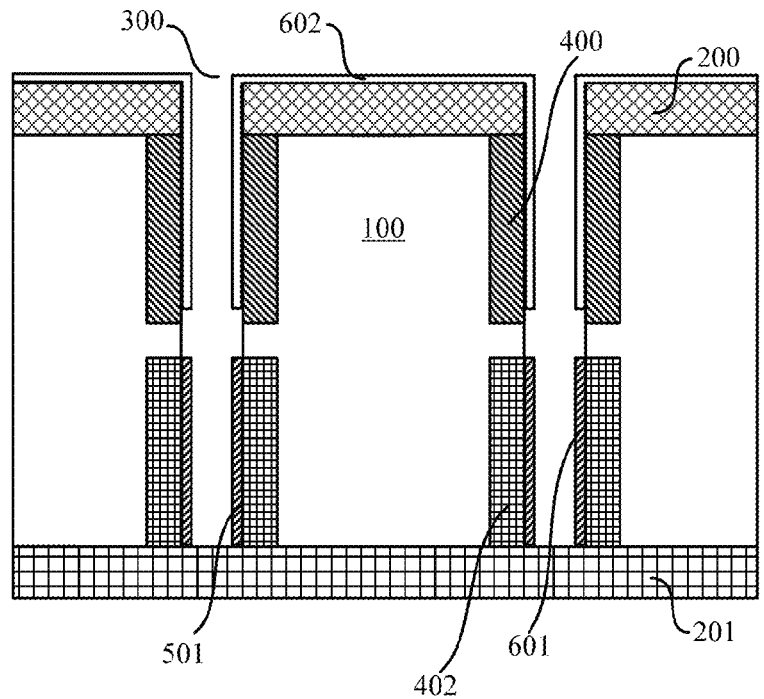
Figure 26:
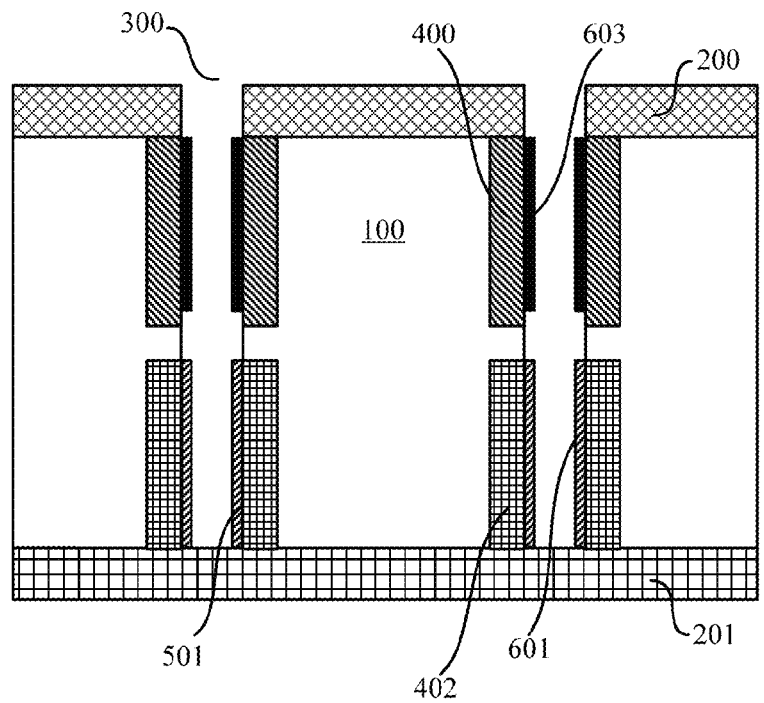

At step S206, as shown in FIG. 21, the substrate 100 is doped with a type of dopants opposite to that of dopants used in the step S203, and second-type doping regions 402 are formed on sidewalls of the first groove 300 that have not been covered by the protection layer 401.

Preferably, as shown in FIG. 22 to FIG. 26, a first contact layer 603 and a second contact 601 are formed on the first first-type doping region 400 and the second-type doping region 402, respectively.

Figure 27A:
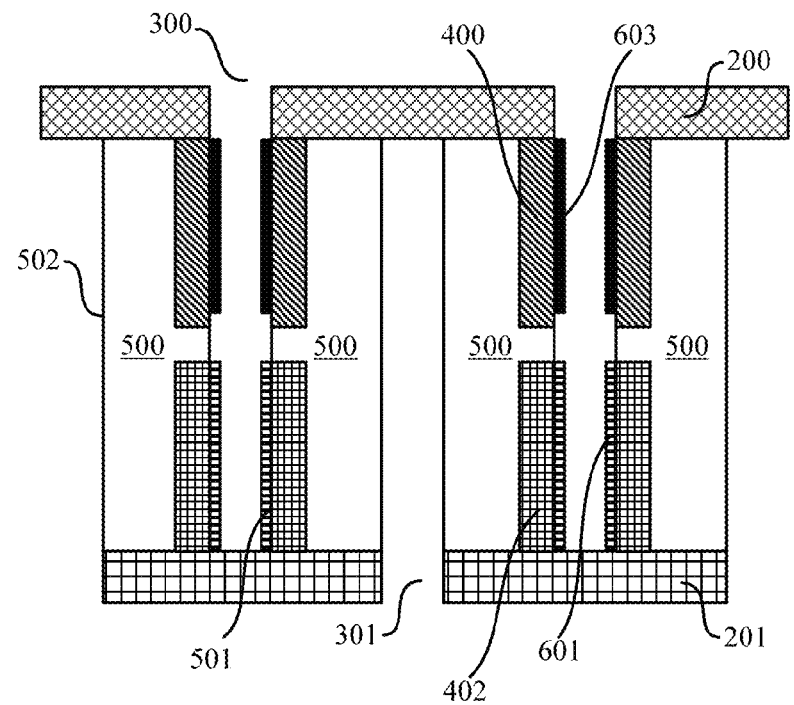
Figure 27B:
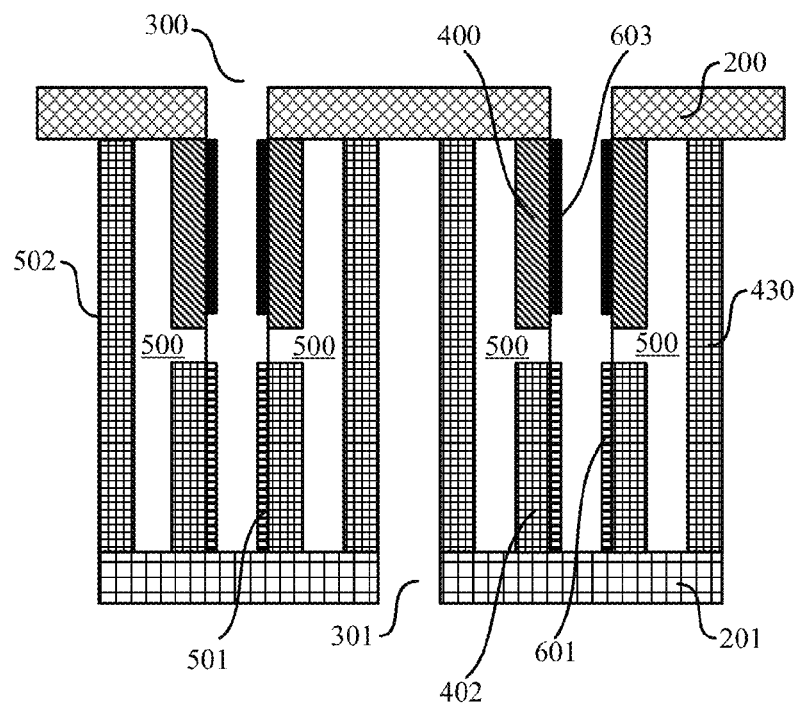

At step S207, as shown in FIG. 27a, at least a second groove 301 is formed on the second surface 102 of the substrate 100, so as to form a vertical strip plate array of solar cell units; wherein each of the second groove 301 is located between two neighboring first grooves 300, and two neighboring solar cell units are connected by a sheet (the first sheet 200 or the second sheet 201). In the present embodiment, at the time of forming the first groove 301, it is necessary to protect the first groove 300 at first; for example, the substrate 100 may be bond to a wafer cap such that the first groove 300 is covered by the wafer cap; then the second surface 102 of the substrate 100 is etched by means of, for example, ion etching, so as to form the second groove 301. In other embodiments, the second groove 301 may be formed by other means, which are not described in detail here in order not to obscure. A part of the substrates 100 between the second groove 301 and the first groove 300 constitutes the semiconductor plates 500; wherein, the sidewalls of the first groove 300 constitute the first surfaces 501 of the semiconductor plates 500, and the sidewalls of the second groove 301 constitute the second surface 502 of the semiconductor plate 500. The thickness of the semiconductor plate 500 is the distance from the first surface 501 to the second surface 502, which is preferably smaller than 150 μm. Finally, the vertical strip plate array of solar cell units is separated from the substrate 100. Preferably, after formation of the semiconductor plate 500, a p+ semiconductor layer 403 or an n+ semiconductor layer 403 may be further formed on the second surface 502 (i.e. the sidewalls of the second groove 301) of the semiconductor plate 500. Specifically, as shown in FIG. 27b, the first surface 501 of the semiconductor plate 500 is protected (e.g. by covering the first groove 300 with a wafer cap), then heavy doping is performed to the second surface 502 of the semiconductor plate 500 by means of, for example, semiconductor dopants diffusion or CVD in-situ doping. In an embodiment, the type of the dopants is same as the type of the dopants in the semiconductor plate 500 (i.e. the substrate 100), and a p+ semiconductor layer 403 or an n+ semiconductor layer 403 is formed on the second surface 502 of the semiconductor plate 500. Usually, the semiconductor layer 403 and the substrate 100 have the same type of doping. The formation of the p+ semiconductor layer 403 or the n+ semiconductor layer 403 enables to effectively reduce the surface resistance of the solar cell units, thereby further improving performance of the solar cell units.

Figure 35:
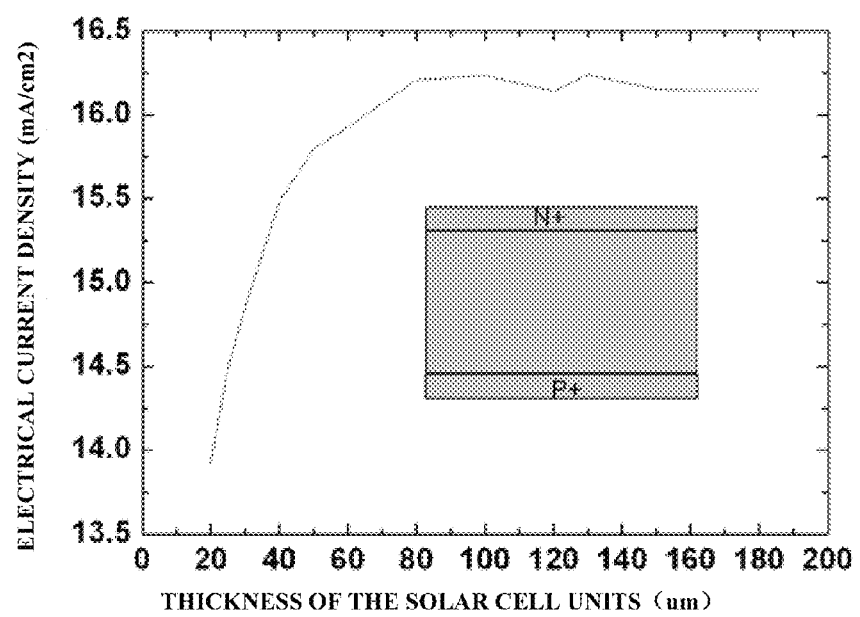
FIG. 35 illustrates a model diagram of relationship between the thickness of a solar cell unit and the current density in the prior art, and FIG. 36
Figure 36:
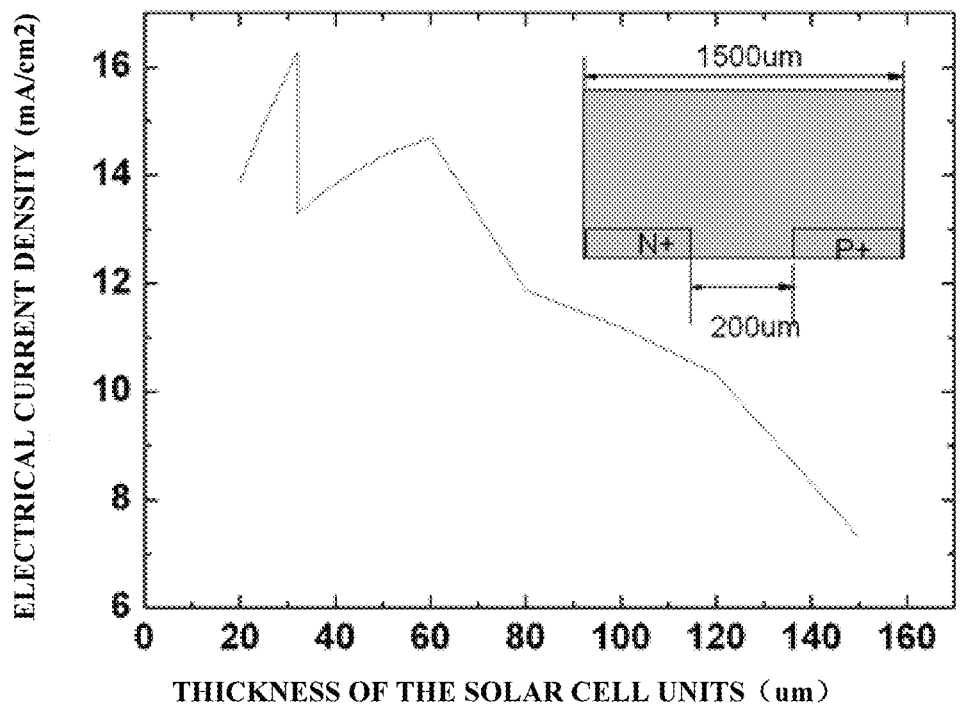
FIG. 36 illustrates a model diagram of the relationship between the thickness of a solar cell unit and the current density provided according to the present invention.
Figure 37:
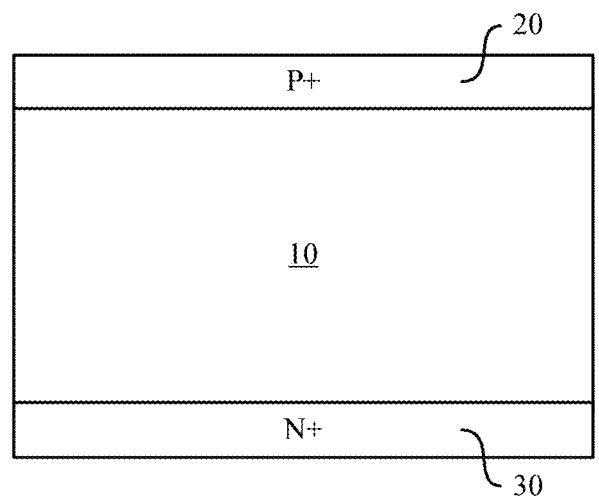
FIG. 37 shows a cross-sectional view of a solar cell unit in the prior art.

With respect to the solar cell unit manufactured according to aforementioned two methods, when its thickness is fairly thin, the photogenic charge carriers generated from the photoelectrical effects are present close to the PN junction, which thus facilitates the photogenic charger carriers to diffuse to the PN junction. Accordingly, as compared to the traditional solar cell unit, in the case the thickness of the solar cell unit is fairly thin, particularly when the thickness of the solar cell unit is less than 80 µm, the solar cell unit provided according to the present invention is capable of collecting effectively the photogenic charger carriers, thus improving electrical current density of the solar cell unit and increasing conversion efficiency of the solar cell unit. Turn to FIG. 35 and FIG. 36. FIG. 35 illustrates a model diagram of relationship between the thickness of a solar cell unit and the current density in the prior art, and FIG. 36 illustrates a model diagram of the relationship between the thickness of a solar cell unit and the current density provided according to the present invention; wherein, the lateral orientations in FIG. 35 and FIG. 36 denote the thickness of a solar cell unit, while the vertical orientations therein denote the current density of the solar cell unit. As shown from FIG. 35, when the thickness of the solar cell unit is in the range of 80 µm-200 µm, the electrical current density of the solar cell unit stays at 16.5 mA/cm$^2$; whereas, when the thickness of the solar cell unit is in the range of 20 µm-80 µm-, the electrical current density of the solar cell unit goes down dramatically as the thickness of the solar cell unit is reduced, which consequently hurts performance of the solar cell unit. Turn to the solar cell unit provided according to the present invention. As shown in FIG. 36, the current density thereof becomes smaller as the thickness of the solar cell unit increases; wherein, in the case the thickness of the solar cell unit is in the range of 20 µm-80 µm, it allows a favorable electrical current density in the solar cell unit; whereas, the thinner the thickness of the solar cell unit is, the better the performance of the solar cell unit becomes. Accordingly, in the case the thickness of the solar cell unit is fairly thin, the solar cell unit provided according to the present invention shows better performance. Since the thickness of the solar cell unit can be reduced without harming the efficiency thereof, thus it allows manufacturing more solar cell units out of each substrate, which therefore increases manufacturing yield. Additionally, because the first contact layer and the second contact layer are located on the same surface of the semiconductor plate, so they would not block light absorption, which therefore enhances efficiency of the solar cell units. Furthermore, since the light absorption surface may be heavily doped in the same type as the semiconductor plate, thus this can further enhance the conversion efficiency.

Figure 29:
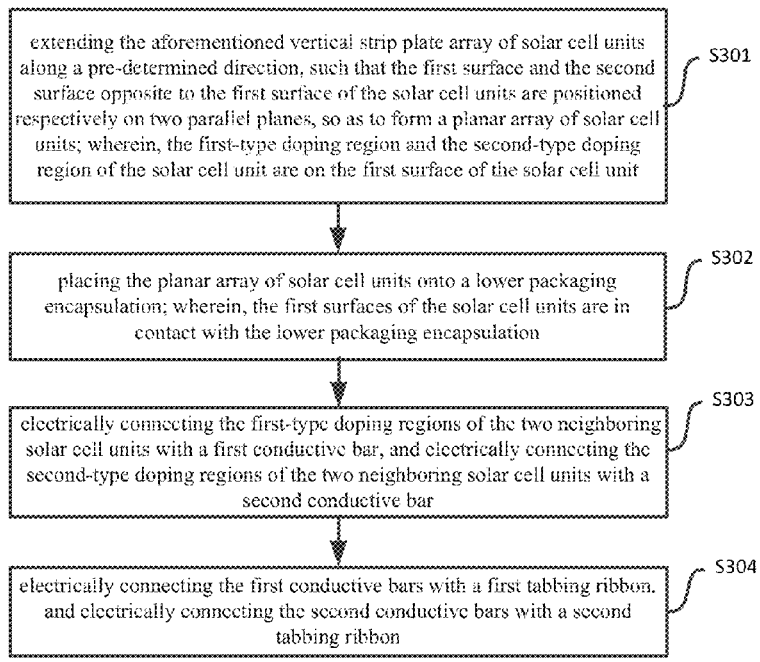
FIG. 29 shows a diagram of a method for manufacturing a solar cell unit assembly according to an aspect of the present invention.

In another embodiment, the present invention further provides a method for manufacturing a solar cell unit assembly from the aforementioned vertical strip plate array of solar cell units, as shown in FIG. 29. Here below, the method for manufacturing the solar cell unit assembly is elucidated with reference to FIG. 30 to FIG. 35.

At step S301, a vertical strip plate array of solar cell units is extended along a pre-determined direction, such that the first surface 501 and the second surface 502 opposite to the first surface 501 of the solar cell are positioned respectively on two parallel planes, so as to form a planar array of solar cell units. Wherein, the first-type doping region 400 and the second-type doping region 402 of the solar cell unit are positioned on the first surface 501 of the solar cell unit.

Figure 30:
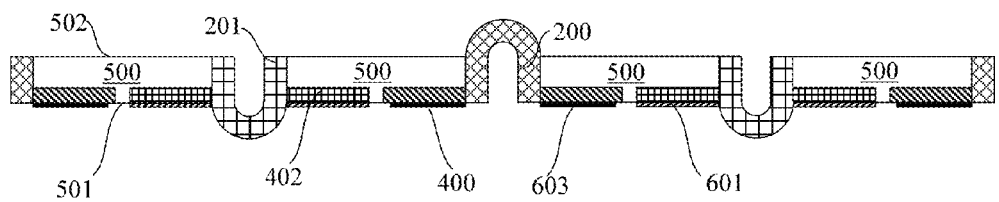
FIG. 30, FIG. 31 and FIG. 33 show cross-sectional views at each stage of forming solar cell unit assembly according to the method shown in FIG. 14.

Specifically, as shown in FIG. 30, with respect to the vertical strip plate array of solar cell units manufactured according to the aforementioned two methods, the whole array of solar cell units is extended evenly from both ends so as to form a planar array of solar cell units. Namely, the two neighboring solar cell units are turned in opposite directions for 90 degrees, such that the first surface 501 and the second surface 502 opposite to the first surface 501 of the solar cell unit are located on two parallel planes, respectively. The sheets (the first sheet 200 and the second sheet 201) between two neighboring solar cell units bend into the form of arc, such that the first surface 501 and the second surface 502 of the solar cell unit become perpendicular to the straight sidewalls of the arced sheet.

At step S302, the planar array of solar cell units is placed onto a lower packaging encapsulation 800; wherein, the first surfaces 501 of the solar cell units are in contact with the lower packaging encapsulation 800.

Specifically, the planar array of solar cell units is packaged. At first, the arced portion between the first sheet 200 and the second sheet 201 is removed by means of laser beam or washing so as to keep only the portions of the first sheet 200 and the second sheet 201 that are in contact with the solar cell units; then, the planar array of solar cell units is placed onto the lower packaging encapsulation 800; wherein the back-light surfaces (i.e. the first surface 501) of the solar cell unit come into contact with the lower packaging encapsulation 800. The material for the lower packaging encapsulation 800 may be any one selected from the group consisting of glass, EVA, PVB, PET, HDPE, PVC, LDPE, PP, PS or combinations thereof. As such, with respect to the two neighboring solar cell units, if the neighboring doping regions thereof are p+ doping regions, the doping regions thereof that are far away from each other are n+ doping regions, vice versa.

At step S303, the first-type doping regions of the two neighboring solar cell units are electrically connected by a first conductive bar 700, and the second-type doping regions 402 of the two neighboring solar cell units are electrically connected by a second conductive bar 701.

Figure 31:
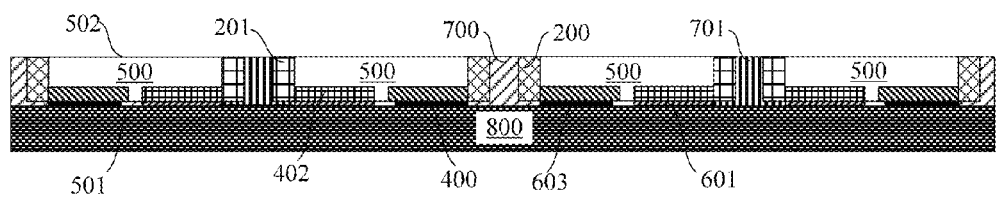
Figure 32:
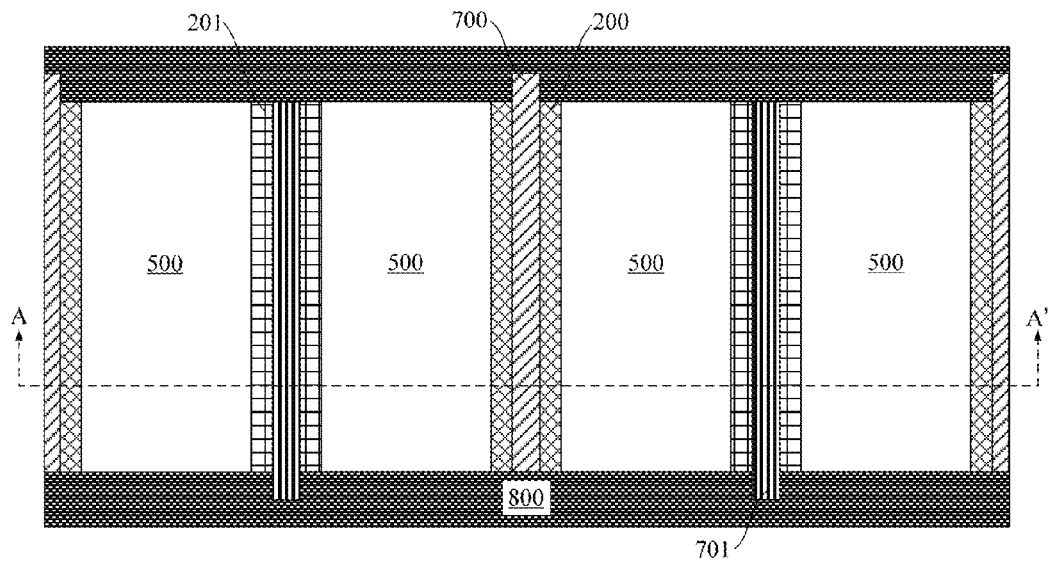
FIG. 32 and FIG. 34 show respectively top views of the cross-sectional vies of FIG. 31 and FIG. 33.

Specifically, as shown in FIG. 31 and FIG. 32 (FIG. 32 is a top view of the diagram shown in FIG. 31, which shows a cross-sectional diagram along AA' direction shown in FIG. 32), a first conductive bar 700 is placed between two solar cell units whose first-type doping regions 400 are adjacent to each other and metal slurry is filled therebetween (e.g. Ag slurry); a second conductive bar 701 is placed between two solar cell units whose second-type doping regions 402 are adjacent to each other and metal slurry is filled therebetween; the metal slurry would fill up the space between two neighboring solar cell units completely and come into contact with the contact layer (or the doping region) on the first surfaces 501 of the solar cell unit; for the sake of the metal slurry, the first conductive bar 700 is capable of electrically connecting the first-type doping regions 400 of the two solar cell units adjacent to the first conductive bar 700, and the second conductive bar 702 also is capable of electrically connecting the second-type doping regions 402 of the two solar cell units that are adjacent to the second conductive bar 702. It is also viable to make use of wielding process to make the first conductive bar 700 capable of electrically connecting the first-type doping regions 400 of two neighboring solar cell units, and to make the second conductive bar 701 capable of electrically connecting the second-type doping regions of two neighboring solar cell units. Wherein, the material for the first conductive bar 700 and/or the second conductive bar 701 may be any one selected from a group consisting of Al, Cu, Ag, Au, Fe, Ni, Pb, Zn, Co, Ti, Mg or combinations thereof. Besides, as shown in FIG. 32, the first conductive bar 700 that electrically connects the first-type doping regions 400 of the solar cell units comes out from a side of the planar array of the solar cell units, and the second conductive bar 701 that electrically connects the second-type doping regions 402 of the solar cell units comes out from the other side of the planar array of solar cell units.

At step S304, the first conductive bars 700 are connected by a first tabbing ribbon 900, and the second conductive bars 701 are connected by a second tabbing ribbon 901.

Figure 33:
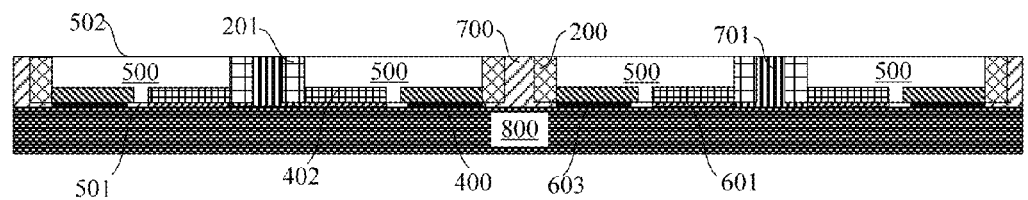
Figure 34:
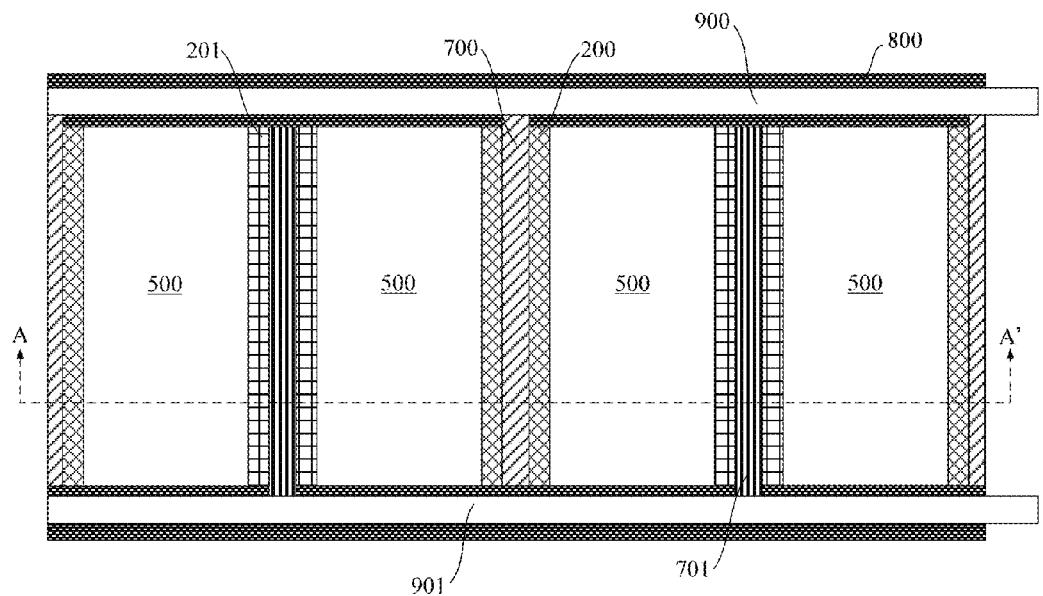

Specifically, as shown in FIG. 33 and FIG. 34 (FIG. 34 is a top view of the diagram shown in FIG. 33, which shows a cross-sectional diagram along AA' direction shown in FIG. 34), from a side of the planar array of solar cell units, a piece of the first tabbing ribbon 900 is adopted to connect the first conductive bars 700 that electrically connect the first-type doping regions 400 of the solar cell units; then, from the other side of the planar array of solar cell unit, a piece of the second tabbing ribbon 901 is adopted to connect the second conductive bars 701 that electrically connect the second-type doping regions 402 of the solar cell units; in this way, the first-type doping regions 400 and the second-type doping regions 402 of all the solar cell units in the planar array are connected, which therefore enables the solar cell units to be in parallel circuits. Wherein, the material for the first tabbing ribbon 900 and/or the second tabbing ribbon 901 may be any one selected from a group consisting of Al, Cu, Ag, Au, Fe, Ni, Pb, Zn, Co, Ti, Mg or combinations thereof.

After completion of aforementioned steps, a planar array of solar cell units is formed, in which the plurality of solar cell units are in parallel circuits. As compared to the traditional solar cell unit assembly with a same area, the solar cell unit assembly provided according to the present invention is capable of higher conversion efficiency and larger output current.

Figure 28:
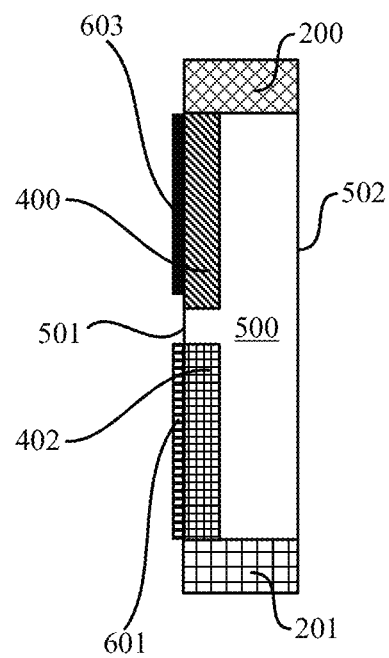
FIG. 28 shows a cross-sectional view of a solar cell unit according to a preferred embodiment of the present invention.

A solar cell unit is further provided according to another aspect of the present invention, as shown in FIG. 28; the solar cell unit comprises a semiconductor plate 500 of first-type doping or second-type doping; the semiconductor plate 500 has a first surface 501 and a second surface 502 opposite to the first surface 501. In the present embodiment, the material for the semiconductor plate 500 includes monocrystalline Si; in other embodiments, the material for the semiconductor plate may be any one selected from a group consisting of monocrystalline Ge, monocrystalline SiGe, poly Si, poly Ge, poly SiGe, amorphous Si, amorphous Ge, amorphous SiGe, compound semiconductors of III-V or II-VI group or combinations thereof. A first-type doping region 400 and a second-type doping region 402 are incorporated into the semiconductor plate 500 on a side of the first surface 501, while the first-type doping is opposite to the second-type doping. Different from the traditional arrangement in the solar cell unit in which the p+ semiconductor layer and the n+ semiconductor layer are located on two surfaces of the solar cell units, in the present invention, both the first-type doping region 400 and the second-type doping region 402 are located on the same surface (i.e. the first surface 501) of the semiconductor plate 500. With respect to the solar cell unit, the second surface 502 of the semiconductor plate 500 functions as the light-absorption surface of the solar cell unit, while the first surface 501 opposite to the second surface 502 functions as the backlight surface of the solar cell unit. The first sheet 200 is arranged on the side surface of the semiconductor plate 500 adjacent to the first doping region 400, and the second sheet 201 is arranged on the side surface of the semiconductor plate 500 adjacent to the second doping region 402; wherein, the material for the first sheet 200 and/or the second sheet 201 includes any one selected from a group consisting of $SiO_2$, $Si_3N_4$, metal silicides, organic insulating materials or combinations thereof. In the subsequent step of connecting the plurality of solar cell units, the first sheet 200 and the second sheet 201 function to isolate the two neighboring solar cell units for avoiding occurrence of short-circuits.

Preferably, the distance between the first surface 501 and the second surface 502 of the semiconductor plate 500 is less than 150 μm; namely, the thickness of the solar cell unit is less than 150 μm.

Preferably, a first contact layer 603 is arranged on the surface of the first-type doping region 400, and a second contact layer 601 is arranged on the surface of the second-type doping region 402, for the purposes of reducing the contact resistance of the solar cell unit. In the present embodiment, the material for the first contact layer 603 and/or the second contact layer 601 may be any one selected from a group consisting of Ni, Pt, Co, Al, Cr, Cu, Ag, W, Au, Fe, Pb, Zn, Ti, Mg, Sn or combinations thereof.

Preferably, a heavy doping region is arranged on the second surface 502 of the semiconductor plate 500, wherein the type of dopants in the heavy doping region is same as the type of dopants in the semiconductor plate 500, and the depth of the heavy doping region is in the range of 1 μm-2 μm. Owing to the existence of the heavy doping region, the surface resistance of the solar cell unit can be effectively further reduced, which therefore further improves the performance of the solar cell units.

Preferably, a transparent insulating layer (not shown) or a transparent conductive layer (not shown) or combination thereof is provide on the second surface 502 of the semiconductor plate 500, for the purposes of further increasing light absorption, reducing surface recombination or lowering surface resistance. Wherein, the material for the transparent insulating layer may be $Si_3N_4$, $SiO_2$, metal silicide or combinations thereof; the material for the transparent conductive layer may be TCO, which includes: $SnO_2$, $In_2O_3$, ZnO, ITO, CdO, $Cd_2SnO_4$, FTO, AZO or combinations thereof.

As compared to the traditional solar cell unit, the solar cell unit provided according to the present invention exhibits following advantages: when the thickness of the solar cell unit is fairly thin, the photogenic charge carriers generated from the photo-electrical effect are present quite close to the PN junction, which thus facilitates the photogenic charger carriers to diffuse to the PN junction. Accordingly, as compared to the traditional solar cell unit, in the case the thickness of the solar cell unit is fairly thin, particularly when the thickness of the solar cell unit is less than 80 μm, the solar cell unit provided according to the present invention is capable of collecting effectively photogenic charger carriers, thus improving electrical current density of the solar cell unit and conversion efficiency of the solar cell unit. Turn to FIG. 35 and FIG. 36. FIG. 35 illustrates a model diagram of relationship between the thickness of a solar cell unit and the current density in the prior art, and FIG. 36 illustrates a model diagram of the relationship between the thickness of a solar cell unit and the current density provided according to the present invention; wherein, the lateral orientations in FIG. 35 and FIG. 36 denote the thickness of a solar cell unit, while the vertical orientations denote the current density of the solar cell unit. As shown from FIG. 35, when the thickness of the solar cell unit is in the range of 80 μm-200 μm, the electrical current density of the solar cell unit stays at 16.5 mA/cm$^2$; whereas, when the thickness of the solar cell unit is in the range of 20 μm-80 μm, the electrical current density of the solar cell unit would go down dramatically as the thickness of the solar cell unit is reduced, which consequently hurts the performance of the solar cell unit. Turn to the solar cell unit provided according to the present invention. As shown in FIG. 36, the current density thereof becomes smaller as the thickness of the solar cell unit increases; wherein, in the case the thickness of the solar cell unit is in the range of 20 μm-80 μm, it allows a favorable electrical current density in the solar cell unit; whereas, the thinner the thickness of the solar cell unit is, the better the performance of the solar cell unit becomes. Accordingly, in the case the thickness of the solar cell unit is fairly thin, the solar cell unit provided according to the present invention shows better performance. Since the thickness of the solar cell unit can be reduced without harming the efficiency thereof, thus it allows manufacturing more solar cell units out of each substrate, which therefore increases manufacturing yield. Additionally, because the first contact layer and the second contact layer are located on the same surface of the semiconductor plate, so they would not block light absorption, which therefore enhances efficiency of the solar cell units. Furthermore, since the light absorption surface may be heavily doped in the same type as the semiconductor plate, thus this can further enhance the conversion efficiency.

A solar cell unit assembly is further provided according to another aspect of the present invention, as shown in FIG. 33; the solar cell unit assembly comprises a plurality of aforementioned solar cell units; wherein the first surface 501 and the second surface 502 opposite to the first surface 501 of the solar cell unit are located respectively on two parallel planes, so as to form a planar array of solar cell units. In the planar array of solar cell units, the two adjacent doping regions of the two neighboring solar cell units are doping regions of the same type, which namely are either the first-type doping regions 401 or the second-type doping regions 402.

A first conductive bar 700 and a second conductive bar 701 are provided. Wherein, the first conductive bar 700 electrically connects the first-type doping regions 400 of the two neighboring solar cell units, and the second conductive bar 701 electrically connects the second-type doping regions 402 of the two neighboring solar cell units. In the present embodiment, the first conductive bar 700 is located between two solar cell units whose first-type doping regions 400 are adjacent to each other, and the second conductive bar 701 is located between two solar cell units whose second-type doping regions 402 are adjacent to each other; further, metal slurry is filled between the two neighboring solar cell units, and the metal slurry comes into contact with the first surfaces 501 of the solar cell units next to the metal slurry; namely, the metal slurry is in contact with the first-type doping regions 400 or the second-type doping regions 402 (or in contact with the first contact layer 603 or the second contact layer 601 of the solar cell units located on two sides of the metal slurry) of the solar cell units located on two sides of the metal slurry, such that it enables to electrically connect the doping regions of the same type of the two solar cell units located on its two sides. Wherein, the first conductive bar 700 that is electrically connected the first-type doping regions 400 of the solar cell units comes out from one side of the planar array of the solar cell units, and the second conductive bar 701 that is electrically connected the second-type doping regions 402 of the solar cell units comes out from the other side of the planar array of solar cell units.

A first tabbing ribbon 900 and a second tabbing ribbon 901 (with reference to FIG. 34) are provided. Wherein, the first tabbing ribbon 900 is adopted to connect the first conductive bars 700, and the second tabbing ribbon 901 is adopted to connect the second conductive bars 701. In the present embodiment, the first tabbing ribbon 900 and the second tabbing ribbon 901 are located on both sides of the planar array of solar cell units, respectively. On one side, the first tabbing ribbon 900 electrically connects the first conductive bars 700 that extend out, on the other side, the second tabbing ribbon 901 electrically connects the second conductive bars 701 that extend out, such that the plurality of solar cell units are in parallel circuits.

Preferably, the planar array of solar cell units, the first conductive bar 700, the second conductive 701, the first tabbing ribbon 900 and the second tabbing ribbon 901 are place onto the lower packaging encapsulation 801; wherein, the lower packaging encapsulation 801 is capable of supporting and fixing the planar array of solar cell units. The material for the lower packaging encapsulation 801 may be any one selected from EVA polymers, PVB, PET, HDPE, PVC, LDPE, PP, PS or combinations thereof.

As compared to the traditional solar cell unit assembly with a same area, the solar cell unit assembly provided according to the present invention is capable of higher conversion efficiency and larger output current.

A solar cell unit assembly is further provided according to another aspect of the present invention. As shown in FIG. 27a and FIG. 27b, the solar cell unit assembly comprises a plurality of aforementioned parallel solar cell units; wherein, with respect to any one of the solar cell unit in the array of solar cell units, one of its end is perpendicular to the first sheet 200 and is connected with a solar cell unit on the other side of the solar cell unit by the first sheet 200, and the other end thereof is perpendicular to the second sheet 201 and is connected with a solar cell unit on the other side of the solar cell unit by the second sheet 201. Wherein, with respect to the two neighboring solar cell units connected by the first sheet 200, their first surfaces 501 face against each other, and their second surfaces 502 face to each other; with respect to the two neighboring solar cell units connected by the second sheet 201, their first surfaces 501 face to each other, and their second surfaces 502 face against each other. Besides, with respect to any two neighboring solar cell units, notwithstanding whether their first surfaces 501 face to or against each other, the first-type doping regions 400 on the first surface 501 are all connected with the first sheet 200, and the second-type doping regions 402 on the first surface 501 are all connected with the second sheet 201.

The array of solar cell units provided according to the present invention is capable of effectively collecting photogenic charge carriers, thereby improving electrical current density of the array of solar cell units and improving conversion efficiency of the array of solar cell units.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing an array of solar cell units comprises:
    a) providing a substrate (100) of first-type doping or second-type doping; the substrate (100) comprises a first surface (101) and a second surface (102) opposite to the first surface (101);
    b) forming at least two first grooves (300) on the first surface (101) of the substrate (100), and forming at least one second groove (301) on the second surface (102) of the substrate (100); wherein, each of the second groove (301) is located between two neighboring first grooves (300), and the depth of the first groove (300) and the second groove (301) is smaller than the thickness of the substrate (100);
    c) doping the sidewalls of the first groove (300) to form a first-type doping region (400) on the sidewalls thereof;
    d) removing a part of the substrates (100) at the bottoms of the first groove (300) and the second groove (301) such that the depth of the first groove (300) and the second groove (301) is still smaller than the thickness of the substrate (100);
    e) forming a protection layer (401) on the sidewalls of the first groove (300);
    f) continuing to remove a part or all of the substrates (100) at the bottoms of the first groove (300) and the second groove (301) to form a plurality of parallel semiconductor plates (500); wherein, the two neighboring semiconductor plates (500) are connected by a sheet;
    g) performing doping to the sidewalls of the first groove (300), wherein the type of dopant is opposite to the dopant type used in step c), forming a second-type doping region (402) on sidewalls of the first groove (300) that have not been covered by the protection layer (401), so as to form a vertical strip plate array of solar cell units.

2. The method of claim 1, wherein, the step c) includes:
    forming a covering layer on the sidewalls and the bottom of the second groove (301); and
    performing semiconductor dopant diffusion or CVD in-situ doping to the substrate (100) so as to form the first-type doping region (400) on the sidewalls of the first groove (300).

3. The method of claim 1, wherein, the step c) includes:
    binding the second surface (102) of the substrate (100) to a wafer cap;
    performing semiconductor dopant diffusion or CVD in-situ doping to the first surface (101) of the substrate (100) in a diffusion furnace so as to form the first-type doping region (400) on the sidewalls of the first groove (300).

4. The method of claim 1, wherein the step g) comprises:
    performing semiconductor dopant diffusion or CVD in-situ doping to the plurality of parallel semiconductor plates (500); at the meantime of forming the second-type doping regions (402) on the sidewalls of the first groove (300) that are not covered by the protection layer (401), forming a semiconductor layer with the same type of dopants as the second-type doping region (402) on the sidewalls of the second groove (301).

5. A method for manufacturing an array of solar cell units comprises:
    a) providing a substrate (100) of first-type doping or second-type doping; the substrate (100) comprises a first surface (101) and a second surface (102) opposite to the first surface (101);
    b) forming at least two first grooves (300) on the first surface (101) of the substrate (100), wherein the depth of the first groove (300) is smaller than the thickness of the substrate (100);
    c) doping the sidewalls of the first groove (300) to form a first-type doping region (400) on the sidewalls thereof;
    d) removing a part of the substrate (100) at the bottom of the first groove (300) such that the depth of the first groove (300) is still smaller than the thickness of the substrate (100), and forming a protection layer (401) on the sidewalls of the first groove (300);
    e) continuing to remove a part or all of the substrate (100) at the bottom of the first groove (300);
    f) performing doping on the sidewalls of the first groove (300), wherein the type of the dopant is opposite to that of dopant used at step c), and forming a second-type doping region (402) on sidewalls of the first groove (300) that have not been covered by the protection layer (401);
    g) forming at least a second groove (301) on the second surface (102) of the substrate (100), so as to form a vertical strip plate array of solar cell units; wherein, each of the second groove (301) is located between two neighboring first grooves (300) and two neighboring solar cell units are connected by a sheet.

6. The method of claim 1 or 5, wherein, the thickness of the semiconductor plate (500) is less than 150 μm.

7. The method of claims 1 or 5, wherein after the step g), further comprises:
    h) forming a first contact layer (603) on the surface of the first-type doping region (400) and forming a second contact layer (601) on the surface of the second-type doping region (402).

8. The method of claim 7, wherein the step h) comprises:
    forming a first metal layer (600) on the surface of the protection layer (401) and on the surface of the second-type doping region (402);
    performing annealing process so as to form a first contact layer (603) on the surface of the second-type doping region (402);
    removing the first metal layer (600) and the protection layer (401) remained from reaction;
    forming a second metal layer (602) on the surfaces of a part or all of the first-type doping regions (400);
    performing annealing to form the second contact layer (601) on the surface of the first-type doping region (400).

9. The method of claim 8, wherein, the step of forming the second metal layer on the surfaces of a part or all of the first-type doping regions comprises:

forming the second metal layer (602) on a part or all of the surfaces of the first-type doping regions (400) by means of angular deposition or dip coating capable of depth controlling.

10. The method of claim 9, wherein:
the material for the first contact layer (603) and/or the second contact layer (601) is any one selected from the group consisting of Ni, Pt, Co, Al, Cr, Cu, Ag, W, Au, Fe, Pb, Zn, Ti, Mg, Sn, metal silicides thereof, or combinations thereof.

11. The method of claim 9, further comprising the step of:
i) depositing a transparent insulating layer or a transparent conductive layer or a combination thereof by means of CVD or PVD; wherein the material for the transparent insulating layer is any one selected from a group consisting of $Si_3N_4$, $SiO_2$, metal silicide or combination thereof; the material for the clear conductive layer is TCO, which includes: $SnO_2$, $In_2O_3$, ZnO, ITO, CdO, $Cd_2SnO_4$, FTO, AZO or combinations thereof.

12. The method of claim 8, wherein:
the material for the first contact layer (603) and/or the second contact layer (601) is any one selected from the group consisting of Ni, Pt, Co, Al, Cr, Cu, Ag, W, Au, Fe, Pb, Zn, Ti, Mg, Sn, metal silicides thereof, or combinations thereof.

13. The method of claim 8, further comprising the step of:
i) depositing a transparent insulating layer or a transparent conductive layer or a combination thereof by means of CVD or PVD; wherein the material for the transparent insulating layer is any one selected from a group consisting of $Si_3N_4$, $SiO_2$, metal silicide or combination thereof; the material for the clear conductive layer is TCO, which includes: $SnO_2$, $In_2O_3$, ZnO, ITO, CdO, $Cd_2SnO_4$, FTO, AZO or combinations thereof.

14. The method of claim 1 or 5, wherein:
the first-type is p type, the second-type is n type; or
the first-type is n type, and the second-type is p type.

15. The method of claim 8, wherein after the step g), further comprises:
after covering the first groove (300) with the wafer cap, performing doping to the sidewalls of the second groove (301); wherein the type of dopant is the same as the type of dopant in the substrate (100).

16. The method of claim 1 or 5, further comprising the step of:
depositing a transparent insulating layer or a transparent conductive layer or a combination thereof by means of CVD or PVD; wherein the material for the transparent insulating layer is any one selected from a group consisting of $Si_3N_4$, $SiO_2$, metal silicide or combination thereof the material for the clear conductive layer is TCO, which includes: $SnO_2$, $In_2O_3$, ZnO, ITO, CdO, $Cd_2SnO_4$, FTO, AZO or combinations thereof.

17. The method of claim 1, or 5, wherein:
the material for the substrate (100) is any one selected from a group consisting of monocrystalline Si, monocrystalline Ge, monocrystalline SiGe, poly Si, poly Ge, poly SiGe, amorphous Si, amorphous Ge, amorphous SiGe, compound semiconductors of III-V or II-VI group or combinations thereof.

18. The method of claim 17, wherein:
the material for the substrate (100) is any one selected from a group consisting of monocrystalline Si, monocrystalline Ge and monocrystalline SiGe, and the crystal orientation of the first surface (101) or the second surface (102) is {110} or {112}, and the crystal orientation of the sidewalls of the first groove (300) and the second groove (301) is {111}.

19. A method for manufacturing a solar cell module comprises:
a) extending a vertical strip plate array of solar cell units manufactured according to the aforementioned method of claim 1 or 2 along a pre-determined direction, such that the first surface (501) and the second surface (502) opposite to the first surface (501) of the solar cell unit are positioned respectively on two parallel planes, so as to form a planar array of solar cell units; wherein, the first-type doping region (400) and the second-type doping region (402) of the solar cell unit are positioned on the first surface (501) of the solar cell unit;
b) placing the planar array of solar cell units onto a lower packaging encapsulation (800); wherein, the first surface (501) of the solar cell unit is in contact with the lower packaging encapsulation (800);
c) electrically connecting the first-type doping regions (400) of two neighboring solar cell units with a first conductive bar (700), and electrically connecting the second-type doping regions (402) of two neighboring solar cell units with a second conductive bar (701);
d) electrically connecting the first conductive bars (700) with a first tabbing ribbon (900), and
electrically connecting the second conductive bars (701) with a second tabbing ribbon (901).

20. The method of claim 19, wherein the step c) comprises:
placing the first conductive bar (700) and filling metal slurry between two solar cell units whose first-type doping regions (400) are adjacent to each other, and placing the second conductive bar (701) and filling metal slurry between two solar cell units whose second-type doping regions (402) are adjacent to each other, such that the first conductive bar 700 is capable of electrically connecting the first-type doping regions (400) of the two solar cell units adjacent to the first conductive bar (700), and the second conductive bar (702) also is capable of electrically connecting the second-type doping regions (402) of the two solar cell units that are adjacent to the second conductive bar (702); the first conductive bar (700) that electrically connects the first-type doping regions (400) of the solar cell units comes out from a side of the planar array of the solar cell units, and the second conductive bar (701) that electrically connects the second-type doping regions (402) of the solar cell units comes out from the other side of the planar array of solar cell units.

21. The method of claim 19, wherein the step d) comprises:
electrically connecting the first conductive bars (700) by a first tabbing ribbon (900) from a side of the planar array of solar cell units; electrically connecting the second conductive bars (701) by a second tabbing ribbon (901) from the other side of the planar array of solar cell units.

* * * * *